(12) United States Patent
Yu et al.

(10) Patent No.: US 11,009,788 B2
(45) Date of Patent: May 18, 2021

(54) METHOD FOR MANUFACTURING OPTICAL ELECTRICAL MODULE AND SUBSTRATE OF AN OPTICAL ELECTRICAL MODULE

(71) Applicant: Centera Photonics Inc., Hsinchu (TW)

(72) Inventors: Shang-Jen Yu, Hsinchu County (TW); Chun-Chiang Yen, Hsinchu (TW)

(73) Assignee: Centera Photonics Inc., Hsinchu (TW)

( * ) Notice: Subject to any disclaimer, the term of this patent is extended or adjusted under 35 U.S.C. 154(b) by 1170 days.

(21) Appl. No.: 15/399,743

(22) Filed: Jan. 6, 2017

(65) Prior Publication Data

US 2017/0123156 A1    May 4, 2017

Related U.S. Application Data

(63) Continuation-in-part of application No. 14/505,512, filed on Oct. 3, 2014, now Pat. No. 9,581,772, and a
(Continued)

(30) Foreign Application Priority Data

| Sep. 9, 2011 | (TW) | 100132684 |
| Sep. 9, 2011 | (TW) | 100132687 |
| Oct. 21, 2011 | (TW) | 100138390 |

(51) Int. Cl.
*G02B 6/136* (2006.01)
*G02B 6/122* (2006.01)
(Continued)

(52) U.S. Cl.
CPC ......... *G03F 7/0005* (2013.01); *G02B 6/122* (2013.01); *G02B 6/136* (2013.01); *G02B 6/4214* (2013.01);
(Continued)

(58) Field of Classification Search
None
See application file for complete search history.

(56) References Cited

U.S. PATENT DOCUMENTS

| 4,897,711 A | 1/1990 | Blonder et al. |
| 6,132,107 A | 10/2000 | Morikawa |

(Continued)

FOREIGN PATENT DOCUMENTS

| CN | 1318869 | 5/2007 |
| CN | 101017228 | 8/2007 |

(Continued)

OTHER PUBLICATIONS

"Office Action of China Counterpart Application", dated Aug. 16, 2013, p. 1-p. 14.

(Continued)

*Primary Examiner* — Shamim Ahmed
(74) *Attorney, Agent, or Firm* — JCIPRNET

(57) ABSTRACT

A method for manufacturing an optical electrical module includes steps as follow. Forming first patterns on a first substrate by a first mask, wherein an angle between a primary flat of the first substrate and an arrangement direction having a maximum number of first pattern units of the first mask is (θ+90°*n), wherein θ is between 22° to 39°, and n is an integer. Subjecting the first substrate to a first patterning process using the first patterns as a mask to form accommodating grooves and a reflective groove connected with the accommodating grooves in the first substrate, wherein an extension direction of each of the accommodating grooves is perpendicular to an extension direction of the reflective groove.

12 Claims, 18 Drawing Sheets

Related U.S. Application Data continuation-in-part of application No. 13/423,259, filed on Mar. 18, 2012, now abandoned.

(51) Int. Cl.
*G03F 7/00* (2006.01)
*G02B 6/42* (2006.01)
*G02B 6/12* (2006.01)

(52) U.S. Cl.
CPC ......... *G02B 6/4243* (2013.01); *G02B 6/4274* (2013.01); *G02B 6/4212* (2013.01); *G02B 6/4249* (2013.01); *G02B 2006/121* (2013.01); *G02B 2006/12061* (2013.01); *G02B 2006/12104* (2013.01); *G02B 2006/12173* (2013.01)

(56) References Cited

U.S. PATENT DOCUMENTS

| | | | |
|---|---|---|---|
| 6,168,395 B1* | 1/2001 | Quenzer | F04B 43/043 417/413.3 |
| 6,680,900 B1* | 1/2004 | Takahashi | G11B 21/21 369/300 |
| 6,859,229 B1 | 2/2005 | Suda | |
| 6,952,514 B2 | 10/2005 | Lee et al. | |
| 7,058,266 B2 | 6/2006 | Arakida et al. | |
| 7,355,166 B2 | 4/2008 | Sherrer et al. | |
| 7,378,646 B2 | 5/2008 | Sherrer | |
| 8,439,578 B2 | 5/2013 | Kropp | |
| 2004/0101020 A1 | 5/2004 | Bhandarkar | |
| 2007/0183724 A1 | 8/2007 | Sato | |
| 2010/0006536 A1* | 1/2010 | Kalvesten | A61N 1/0551 216/11 |

FOREIGN PATENT DOCUMENTS

| | | |
|---|---|---|
| CN | 101354462 | 1/2009 |
| JP | 2003167175 | 6/2003 |
| JP | 2007121973 | 5/2007 |
| JP | 2007334166 | 12/2007 |
| TW | M297101 | 9/2006 |
| TW | 201129834 | 9/2011 |

OTHER PUBLICATIONS

"Office Action of Taiwan Counterpart Application", dated Nov. 7, 2013, p. 1-p. 7.
"Office Action of Taiwan Counterpart Application", dated Nov. 19, 2013, p. 1-p. 4.
"Office Action of Taiwan Counterpart Application", dated Dec. 5, 2013, p. 1-p. 7.
"Office Action of China Counterpart Application", dated Jan. 14, 2014, p. 1-p. 13.
"Office Action of Taiwan Counterpart Application", dated Apr. 3, 2014, p. 1-p. 5.

\* cited by examiner

US 11,009,788 B2

METHOD FOR MANUFACTURING OPTICAL ELECTRICAL MODULE AND SUBSTRATE OF AN OPTICAL ELECTRICAL MODULE

CROSS-REFERENCE TO RELATED APPLICATION

This application is a continuation-in-part application of and claims the priority benefit of a prior application Ser. No. 14/505,512, filed on Oct. 3, 2014, now allowed. The prior application Ser. No. 14/505,512 is a continuation-in-part application of and claims the priority benefit of prior application Ser. No. 13/423,259, filed on Mar. 18, 2012, which claims the priority benefit of Taiwan application serial no. 100132684, filed on Sep. 9, 2011, Taiwan application serial no. 100132687, filed on Sep. 9, 2011 and Taiwan application serial no. 100138390, filed on Oct. 21, 2011. The entirety of each of the above-mentioned patent applications is hereby incorporated by reference herein and made a part of this specification.

BACKGROUND OF THE INVENTION

Field of the Invention

The invention relates to an optical electrical module. Particularly, the invention relates to an optical electrical module used for optical communication.

Description of Related Art

In a field of optical communication, a signal transmitter uses an optical electrical module that serves as a signal transmitting element to convert an electric signal into an optical signal, and a signal receiver uses the optical electrical module that serves as a signal receiving element to convert the received optical signal into the electric signal. Therefore, the optical electrical module is an indispensable device in the field of optical communication.

FIG. 1 is a schematic diagram of a conventional optical electrical module. Referring to FIG. 1, the conventional optical electrical module 100 is adapted to provide a light signal, and includes a circuit board 110, a base 120, a light-emitting element 130, an optical fiber 140 and a chip 150. The base 120 and the chip 150 are disposed on the circuit board 110, and the chip 150 is electrically connected to the circuit board 110 through a bonding wire 162. The base 120 has surfaces 122 and 123 parallel to a bottom surface 121 thereof. A reflective surface 124 of the base 120 is connected to the surfaces 122 and 123 and located between the surfaces 122 and 123, and tilts a predetermined angle relative to the surface 123. The light-emitting element 130 is disposed on a pad 125 on the surface 122, and is electrically connected to the chip 150 through the pad 125 and a bonding wire 164. A part of the light-emitting element 130 protrudes out of the pad 125 and faces the reflective surface 124. The optical fiber 140 is disposed on the surface 123 of the base 120.

The chip 150 is adapted to control the light-emitting element 130 to emit a corresponding light signal 132 according to information to be transmitted, and the reflective surface 124 reflects the light signal 132 into the optical fiber 140 for transmitting the light signal 132 through the optical fiber 140. Moreover, a signal receiver can use another optical electrical module to receive the light signal 132 transmitted by the optical fiber 140. The optical electrical module used for receiving the light signal 132 is similar to the optical electrical module 100, and a difference there between is that the light-emitting element 130 is replaced by a light-receiving element.

In the conventional optical electrical module 100, since a part of the light-emitting element 130 protrudes out of the pad 125 to facilitate providing the light signal 132 to the reflective surface 124, a contact area between the light-emitting element 130 and the pad 125 is relatively small. Therefore, the light-emitting element 130 can easily fall off, which leads to poor reliability of the optical electrical module 100. Similarly, the conventional optical electrical module used for receiving the light signal also has the problem that the light-receiving element can easily fall off.

Packaging of the optical device is one of key techniques that influence a yield and a cost of the optical electrical element and the optical electrical module. Referring to FIG. 2, FIG. 2 is a schematic diagram of a package structure of another optical electrical module according to the conventional technique. The optical electrical module 100A includes a circuit board 101, a light-emitting/receiving element 103, an optical fiber 104 (which is also referred to as waveguide), a substrate 102 and a cover plate 106. The substrate 102 is disposed on the circuit board 101. The light-emitting/receiving element 103 is disposed on the substrate 102. The optical fiber 104 used for transmitting a light signal 105 is disposed on the substrate 102. The light signal 105 can be transmitted to the light-emitting/receiving element 103 through a reflective surface 102a of the substrate 102.

Since the optical fiber 104, the reflective surface 102a and the light-emitting/receiving element 103 have to be accurately aligned, a microscope is used with assistance of a special tool to adjust a position of the cover plate 106, so as to fix the optical fiber 104 on the substrate 102, and then follow-up packaging steps are performed. Such practice requires a highly skilled worker, which not only has a high cost, but also has low process robustness. Therefore, an advanced fixing module is required to be provided to facilitate the packaging process of the optical device and ameliorate the process robustness and yield.

SUMMARY OF THE INVENTION

The invention is directed to an optical electrical module, which has favorable yield and cost.

The invention provides a method for manufacturing an optical electrical module which includes steps as follow. Forming a plurality of first patterns on a first substrate by a first mask, wherein an angle between a primary flat of the first substrate and an arrangement direction having a maximum number of first pattern units of the first mask is (θ+90°*n), wherein θ is between 22° to 39°, and n is an integer. Subjecting the first substrate to a first patterning process using the first patterns as a mask to form a plurality of accommodating grooves and a reflective groove connected with the accommodating grooves in the first substrate, wherein an extension direction of each of the accommodating grooves is perpendicular to an extension direction of the reflective groove.

In an embodiment of the invention, a depth of each of the accommodating grooves and a depth of the reflective groove are larger than 120 μm, respectively.

In an embodiment of the invention, side walls of the accommodating grooves and side walls of the reflective groove are respectively inclined surfaces of 42° to 49°.

In an embodiment of the invention, the method for manufacturing the optical electrical module includes steps as follow. Patterning a second substrate to form a plurality of accommodating cavities in the second substrate. Disposing a plurality of optical electrical elements in the accommodating cavities. Disposing a plurality of light guide elements in the accommodating grooves. Bonding the first substrate and the second substrate, wherein the optical electrical elements and the light guide elements are disposed there between.

In an embodiment of the invention, a plurality of alignment grooves are further formed in one of the first substrate and the second substrate, and a plurality of alignment bumps are further formed in the other one of the first substrate and the second substrate. The alignment bumps are adapted to be engaged with the alignment grooves when the first substrate and the second substrate are bonded with each other.

In an embodiment of the invention, a depth of each of the accommodating grooves, a depth of the reflective groove, a depth of each of the alignment grooves, a depth of each of the accommodating cavities and a height of each of the alignment bumps are larger than 120 μm, respectively.

In an embodiment of the invention, side walls of the accommodating grooves, side walls of the reflective groove, side walls of the alignment grooves, side walls of the accommodating cavities and side walls of the alignment bumps are respectively inclined surfaces of 42° to 49°.

In an embodiment of the invention, the alignment grooves are formed in the first substrate, and the alignment bumps are formed in the second substrate. The alignment grooves, the accommodating grooves and the reflective groove are formed simultaneously during the first patterning process. A method for forming the alignment bumps includes steps as follow. Forming a plurality of second patterns on the second substrate by a second mask, wherein a primary flat of the second substrate and an angle between an arrangement direction having a maximum number of second pattern units of the second mask is (θ+90°*n). Subjecting the second substrate to a second patterning process using the second patterns as a mask to form the alignment bumps in the second substrate.

In an embodiment of the invention, the accommodating cavities are formed after the alignment bumps are formed. A method for forming the accommodating cavities includes steps as follow. Forming a plurality of third patterns on the second substrate by a third mask, wherein an angle between a primary flat of the second substrate and an arrangement direction having a maximum number of third pattern units of the third mask is (θ+90°*n). Subjecting the second substrate to a third patterning process using the third patterns as a mask to form the accommodating cavities.

In an embodiment of the invention, the alignment grooves are formed in the second substrate, and the alignment bumps are formed in the first substrate. A method for forming the accommodating cavities and the alignment grooves includes steps as follow. Forming a plurality of second patterns on the second substrate by a second mask, wherein an angle between a primary flat of the second substrate and an arrangement direction having a maximum number of second pattern units of the second mask is (θ+90°*n). Subjecting the second substrate to a second patterning process using the second patterns as a mask to form the accommodating cavities and the alignment grooves simultaneously. A method for forming the alignment bumps includes steps as follow. Forming a plurality of third patterns on the first substrate by a third mask, wherein an angle between a primary flat of the first substrate and an arrangement direction having a maximum number of third pattern units of the third mask is (θ+90°*n). Subjecting the first substrate to a third patterning process using the third patterns as a mask to form the alignment bumps in the first substrate.

In an embodiment of the invention, an etching rate between a side etching and an under etching is between 1:2 and 1:20 when patterning the first substrate.

In an embodiment of the invention, an etching solution for patterning the first substrate comprises potassium hydroxide (KOH), isopropyl alcohol (IPA), $H_2O$, inhibitors, tetramethylammonium hydroxide (TMAH) and methyl alcohol.

The invention provides a substrate of an optical electrical module. The substrate includes a plurality of accommodating grooves and a reflective groove. The accommodating grooves respectively extend along a first direction. The reflective groove is connected with the accommodating grooves and extends along a second direction perpendicular to the first direction.

In an embodiment of the invention, the substrate is a (100) silicon wafer.

In an embodiment of the invention, a depth of each of the accommodating grooves and a depth of the reflective groove are larger than 120 μm, respectively.

In an embodiment of the invention, the depth of each of the accommodating grooves and the depth of the reflective groove are the same.

In an embodiment of the invention, side walls of the accommodating grooves and side walls of the reflective groove are respectively inclined surfaces of 42° to 49°.

In an embodiment of the invention, the accommodating grooves are parallel to each other.

In an embodiment of the invention, all the accommodating grooves are perpendicular to the reflective groove.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

First Embodiment

Figure 1:
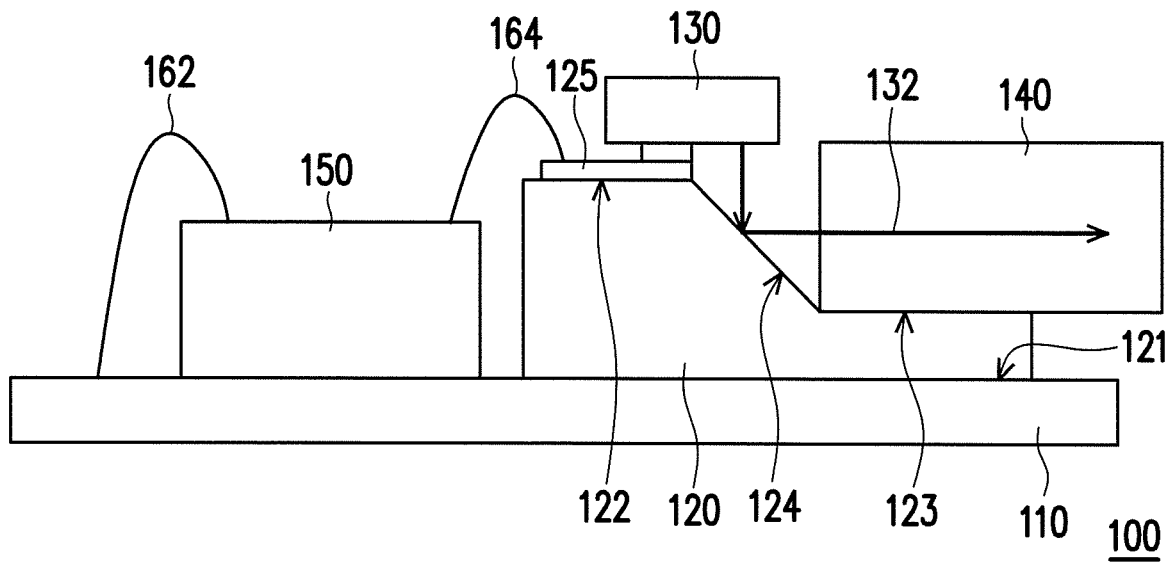
FIG. 1 is a schematic diagram of a conventional optical electrical module.
Figure 2:
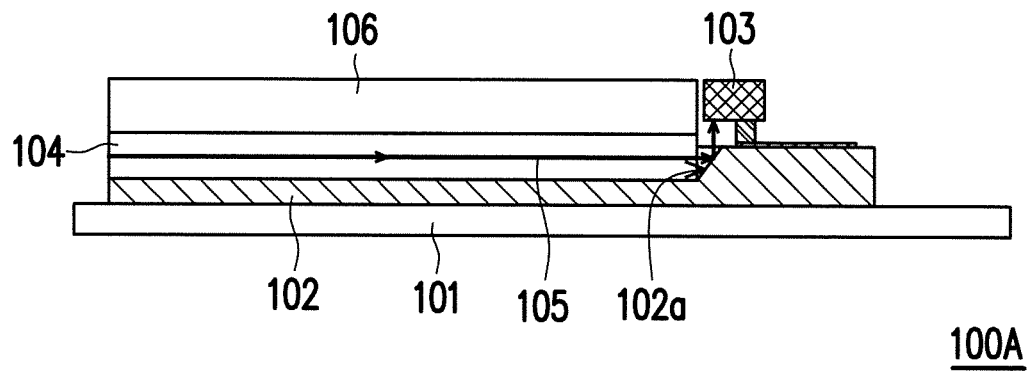
FIG. 2 is a schematic diagram of a package structure of another optical electrical module according to the conventional technique.
Figure 3A:
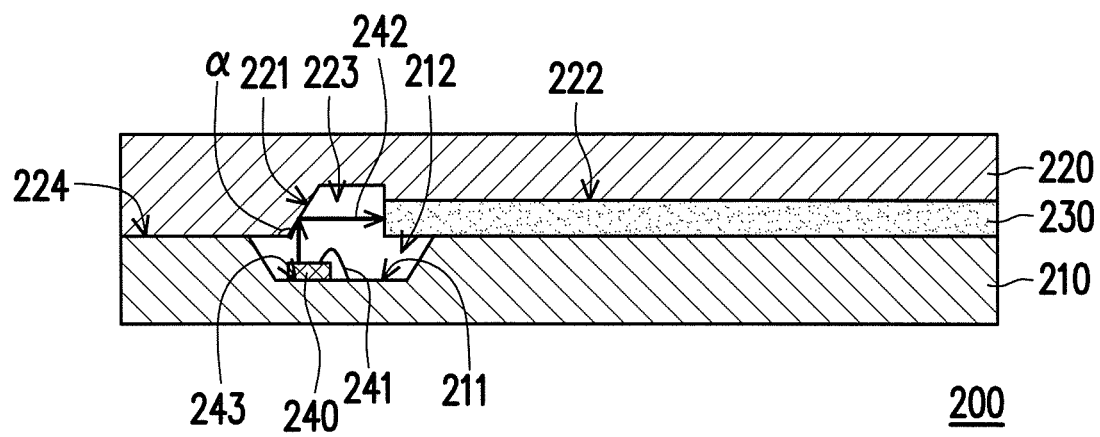
FIG. 3A and FIG. 3B are cross-sectional views of an optical electrical module according to a first embodiment of the invention.
Figure 3B:
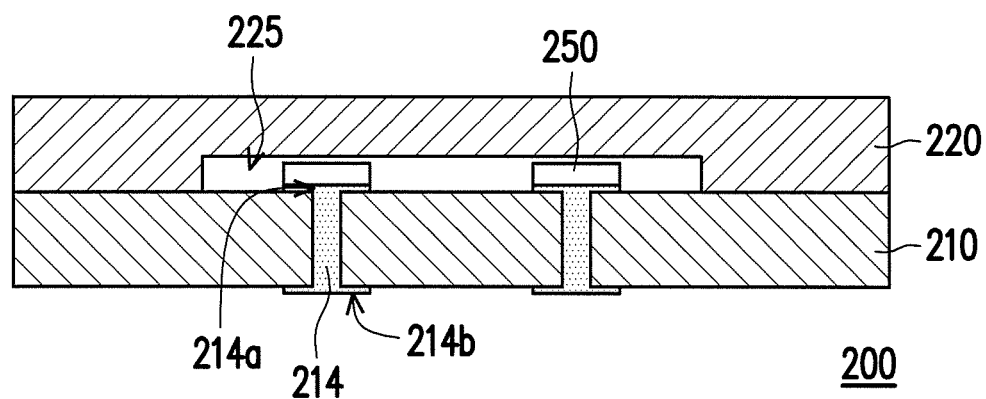
Figure 4:
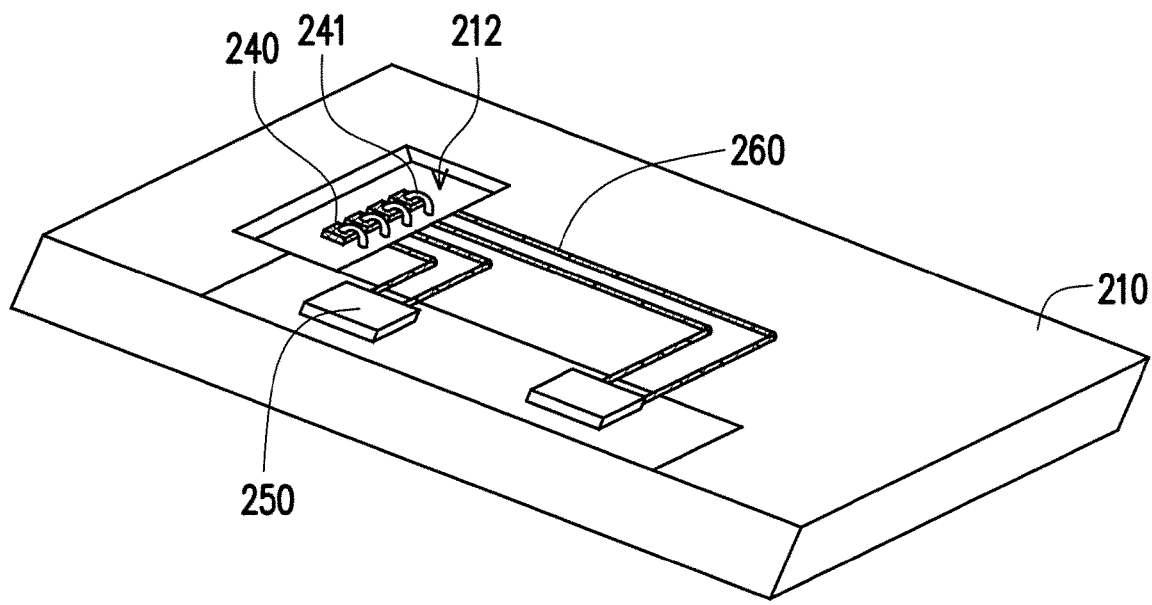
FIG. 4 is a three-dimensional view of a first substrate and elements disposed thereon of FIG. 3A and FIG. 3B.
Figure 5:
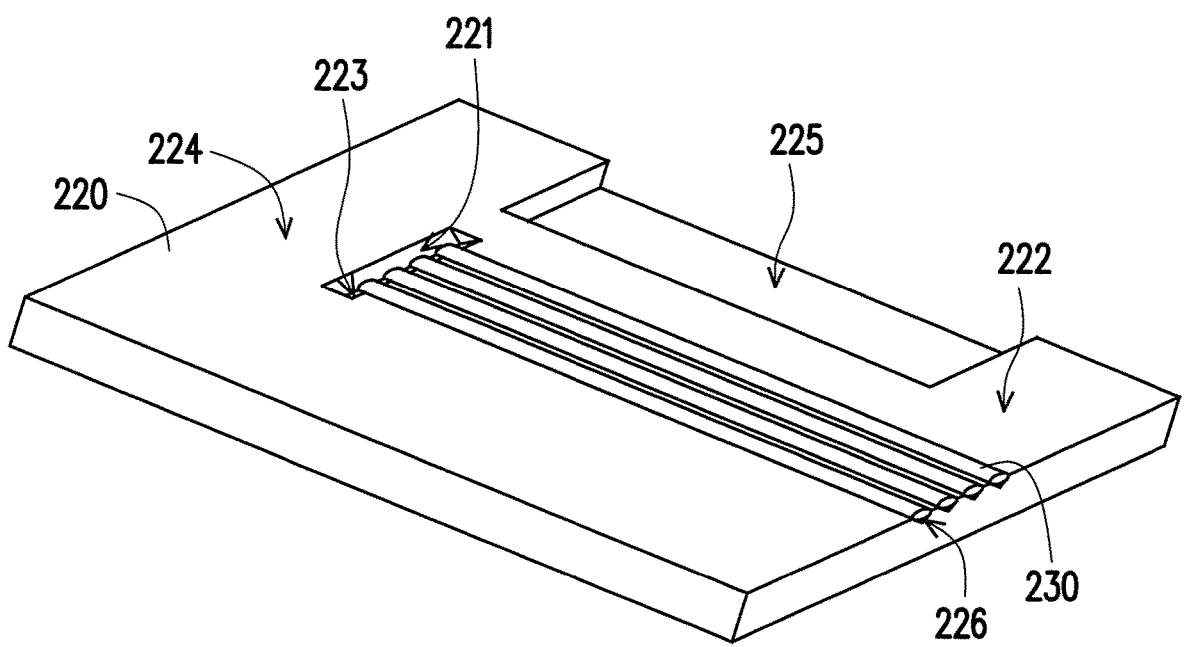
FIG. 5 is a three-dimensional view of a second substrate and elements disposed thereon of FIG. 3A and FIG. 3B.

FIG. 3A and FIG. 3B are cross-sectional views of an optical electrical module according to the first embodiment of the invention. FIG. 4 is a three-dimensional view of a first substrate and elements disposed thereon of FIG. 3A and FIG. 3B. FIG. 5 is a three-dimensional view of a second substrate and elements disposed thereon of FIG. 3A and FIG. 3B. Referring to FIG. 3A, FIG. 4 and FIG. 5, the optical electrical module 200 of the present embodiment is a light signal transmitting module. The optical electrical module 200 includes a first substrate 210, a second substrate 220, a bearing portion 222 and at least one optical electrical element 240. The bearing portion 222 is disposed between the first substrate 210 and the second substrate 220.

In the present embodiment, the bearing portion 222 is, for example, formed on the second substrate 220. In other embodiments, the bearing portion can also be formed on the first substrate. The optical electrical module 200 further includes at least one light guide element 230 or is externally connected to at least one light guide element 230, and the bearing portion 222 is used to limit the light guide element 230. In FIG. 4 and FIG. 5, a plurality of the light guide elements 230 and a plurality of the optical electrical elements 240 are illustrated. However, the numbers of the light guide elements 230 and the optical electrical elements 240 are not limited by the invention. In the present embodiment, the optical electrical element 240 is, for example, a light-emitting element. The first substrate 210 is, for example, a semiconductor substrate, and the second substrate 220 is, for example, a semiconductor substrate or a glass substrate. The semiconductor substrate is, for example, a silicon substrate, though the invention is not limited thereto.

The second substrate 220 is combined with the first substrate 210. The second substrate 220 has a reflective surface 221 facing the first substrate 210. The optical electrical element 240 is disposed on a surface 211 of the first substrate 210 facing the reflective surface 221. The surface 211 is opposite to the reflective surface 221. The optical electrical element 240 is configured for providing a light signal 242 to the reflective surface 221. The reflective surface 221 and the light guide element 230 are disposed on an optical path of the light signal 242. The reflective surface 221 is adapted to reflect the light signal 242 into the light guide element 230, so that the light signal 242 can be transmitted through the light guide element 230.

The first substrate 210 may have a cavity 212, and the optical electrical elements 240 are disposed in the cavity 212. The optical electrical element 240 can be a laser or other suitable light-emitting elements, where the laser can be a vertical cavity surface emitting laser (VCSEL). A size of the cavity 212 is determined according to a size of the optical electrical elements 240 disposed therein. In principle, a minimum size of the cavity 212 is required to accommodate the optical electrical elements 240. In the present embodiment, each of the optical electrical elements 240 is, for example, electrically connected to an internal circuit (not shown) of the first substrate 210 through a bonding wire 241. Moreover, in the present embodiment, the light guide element 230 faces the reflective surface 221, and a space is maintained between the light guide element 230 and the reflective surface 221. The light guide element 230 of the present embodiment is, for example, an optical fiber or a light guide strip made of polymer or a dielectric material.

The second substrate 220 may have a cavity 223, and the reflective surface 221 is a surface of the cavity 223. The reflective surface 221 can be selectively coated with a reflection material to improve reflectivity thereof. As shown in FIG. 5, the bearing portion 222 is configured with at least one positioning structure 226 for fixing the light guide element 230. The number of the positioning structures 226 can correspond to the number of the light guide elements 230, so that each of the light guide elements 230 can be fixed in a corresponding positioning structure 226. Each of the positioning structures 226 of the present embodiment is, for example, a groove; though the invention is not limited thereto, and in other embodiments, the positioning structures 226 can be protruded positioning structures. Moreover, it should be noticed that in FIG. 3A, an included angle α between the reflective surface 221 and a surface 224 of the second substrate 220 connected to the first substrate 210 can be designed according to a position of the optical electrical elements 240 and a position of the positioning structures 226 of the bearing portion 222. When the included angle α is between 120 degrees and 140 degrees, the optical electrical module 200 may have a good effect of transmitting the light signal 242. Further, when the included angle α is 135 degrees or 125 degrees, the reflective surface 221 is easily fabricated.

Referring to FIG. 3B, FIG. 4 and FIG. 5, the optical electrical module 200 of the present embodiment may further include at least one control unit 250. The control unit 250 is, for example, disposed on the first substrate 210, and is electrically connected to the optical electrical element 240. In detail, the control unit 250 is, for example, a control chip. As shown in FIG. 4, the control unit 250 can be electrically connected to the corresponding optical electrical elements 240 through wires 260 disposed on the first substrate 210 and an internal circuit (not shown) of the first substrate 210. The control unit 250 can be used to control one or a plurality of the optical electrical elements 240, which is not limited by the invention. The control unit 250 controls the optical electrical element 240 to send the corresponding light signal 242 according to information to be transmitted. In the present embodiment, as shown in FIG. 3B and FIG. 5, the second substrate 220 may have a containing slot 225 for containing the control unit 250, though the invention is not limited thereto, and in other embodiments, the containing slot 225 used for containing the control unit 250 can also be disposed on the first substrate 210.

Figure 6:
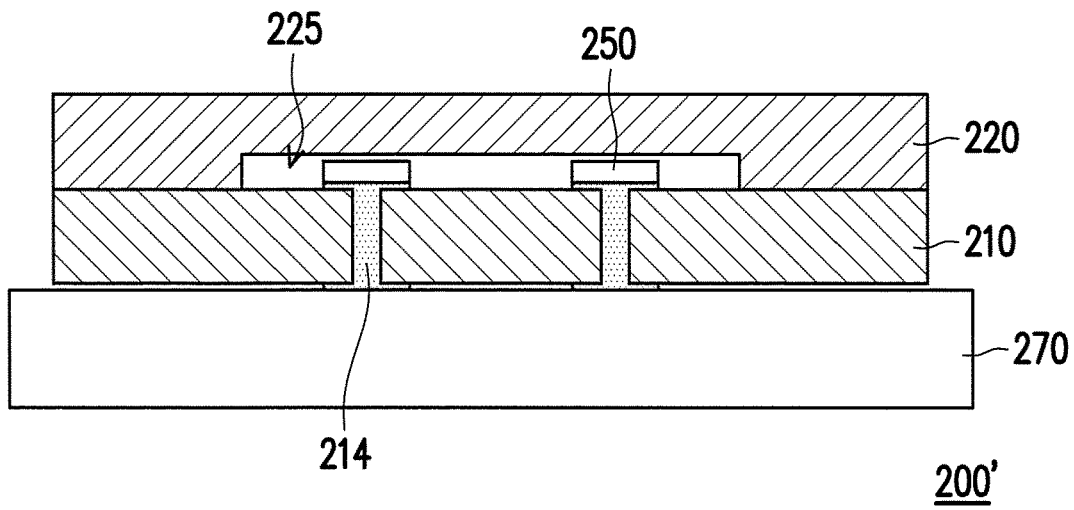
FIG. 6 is a cross-sectional view of an optical electrical module according to another embodiment of the invention.

Moreover, as shown in FIG. 3B, the first substrate 210 of the present embodiment can be configured with at least one through silicon via 214. One end 214a of each of the through silicon vias 214 is electrically connected to the corresponding control unit 250. In this way, each of the control units 250 can be electrically connected to other elements through another end 214b of the through silicon via 214. For example, FIG. 6 is a cross-sectional view of an optical electrical module according to another embodiment of the invention. Referring to FIG. 6, in the present embodiment, compared to the optical electrical module 200, the optical electrical module 200' further includes a circuit board 270. The first substrate 210 is disposed on the circuit board 270. The control units 250 can be electrically connected to the circuit board 270 through the through silicon vias 214.

Referring to FIG. 3A, in the optical electrical module 200 of the present embodiment, the optical electrical element 240 is on the first substrate 210, and the light guide element 230 is disposed on the second substrate 220. Therefore, a bottom surface 243 of the optical electrical element 240 can be fully fixed on the surface 211 of the cavity 212 of the first substrate 220, where the surface 211 faces the reflective surface 221. Compared to the conventional technique that the light-emitting element and the pad has a small contact area, a contact area between the optical electrical element 240 of the optical electrical module 200 and the surface 211 of the present embodiment is relatively large, so that the optical electrical element 240 can be tightly fixed on the first substrate 210 to improve reliability of the optical electrical module 200. Moreover, in the present embodiment, a semiconductor substrate can be used as the first substrate 210. Since a fabrication technique of the semiconductor substrate is mature, a thickness of the first substrate 210 can be effectively reduced. Moreover, in the present embodiment, a semiconductor substrate or a glass substrate can be used as the second substrate 220, and since the fabrication technique of the semiconductor substrate and a grinding technique of the glass substrate are mature, the thickness of the second substrate 220 can also be effectively reduced. Therefore, the optical electrical module 200 of the present embodiment has an advantage of thinness.

Figure 7:
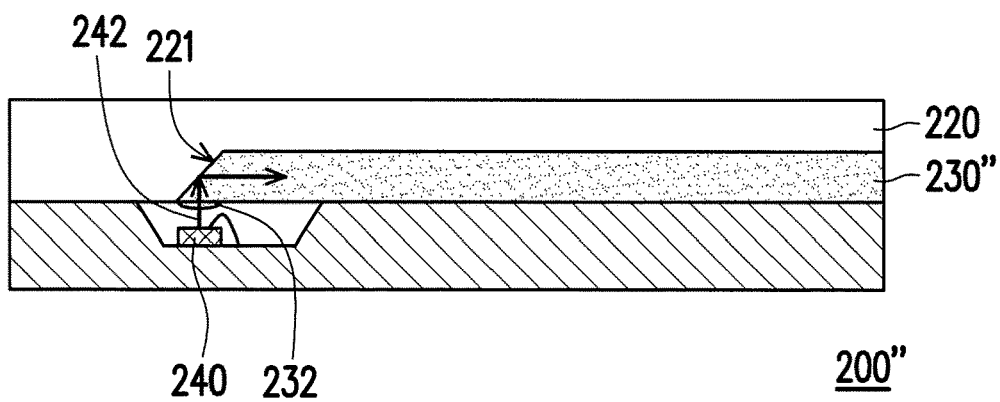
FIG. 7 is a cross-sectional view of an optical electrical module according to still another embodiment of the invention.

FIG. 7 is a cross-sectional view of an optical electrical module according to still another embodiment of the invention. Referring to FIG. 7, the optical electrical module 200" of the present embodiment is similar to the optical electrical module 200 of the first embodiment, and a difference there between is that in the optical electrical module 200", a light guide element 230" can cover the reflective surface 221 of the second substrate 220. Namely, the light guide element 230" can contact the reflective surface 221. There is no space between the light guide element 230" and the reflective surface 221. A material of the light guide element 230" can be polymer or a dielectric material. Moreover, it should be noticed that the light guide element 230" may have a focusing portion 232. The focusing portion 232 is located between the optical electrical element 240 and the reflective surface 221, and a position of the focusing portion 232 corresponds to positions of the optical electrical element 240 and the reflective surface 221, so as to converge the light signal 242 provided by the optical electrical element 240. Use of the focusing portion 232 can further improve a light coupling efficiency of the optical electrical module 200".

Figure 8:
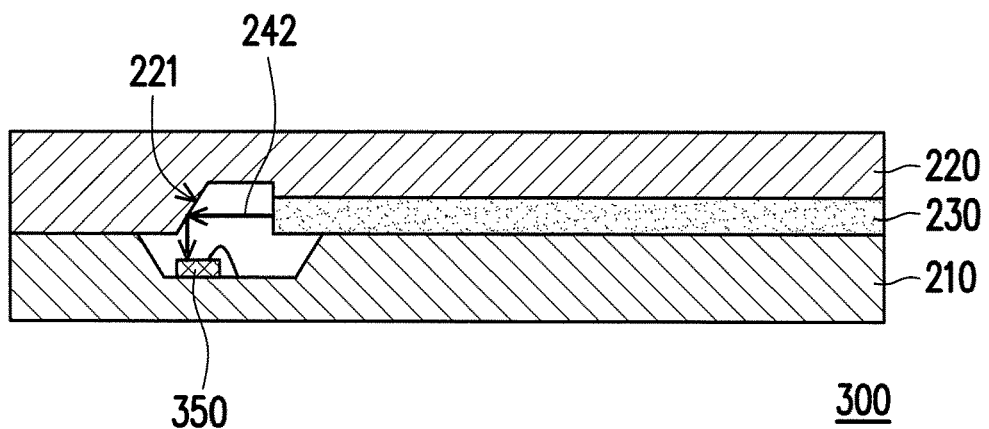
FIG. 8 is a cross-sectional view of an optical electrical module according to yet another embodiment of the invention.

FIG. 8 is a cross-sectional view of an optical electrical module according to yet another embodiment of the invention. Referring to FIG. 8, the optical electrical module 300 of the present embodiment is similar to the optical electrical module 200 of the first embodiment, and a difference there between is that the optical electrical module 300 is a light signal receiving module. In detail, a structure of the optical electrical module 300 is similar to that of the optical electrical module 200, and a difference there between is that in the optical electrical module 300, an optical electrical element 350 is used to replace the optical electrical element 240 of the optical electrical module 200, and the optical electrical element 350 is a light receiving element. The optical electrical element 350 is, for example, a photo diode or other suitable photo sensors. In the optical electrical module 300, the light guide element 230 is adapted to transmit the light signal 242 to the reflective surface 221 of the second substrate 220, and the reflective surface 221 is adapted to reflect the light signal 242 to the optical electrical element 350 for reception. Moreover, a control unit (not shown) of the optical electrical module 300 can convert the light signal 242 received by the optical electrical element 350 into an electric signal. The optical electrical module 300 of the present embodiment has the same advantage with that of the optical electrical module 200 of the first embodiment, which is not repeated therein.

Second Embodiment

Figure 9A:
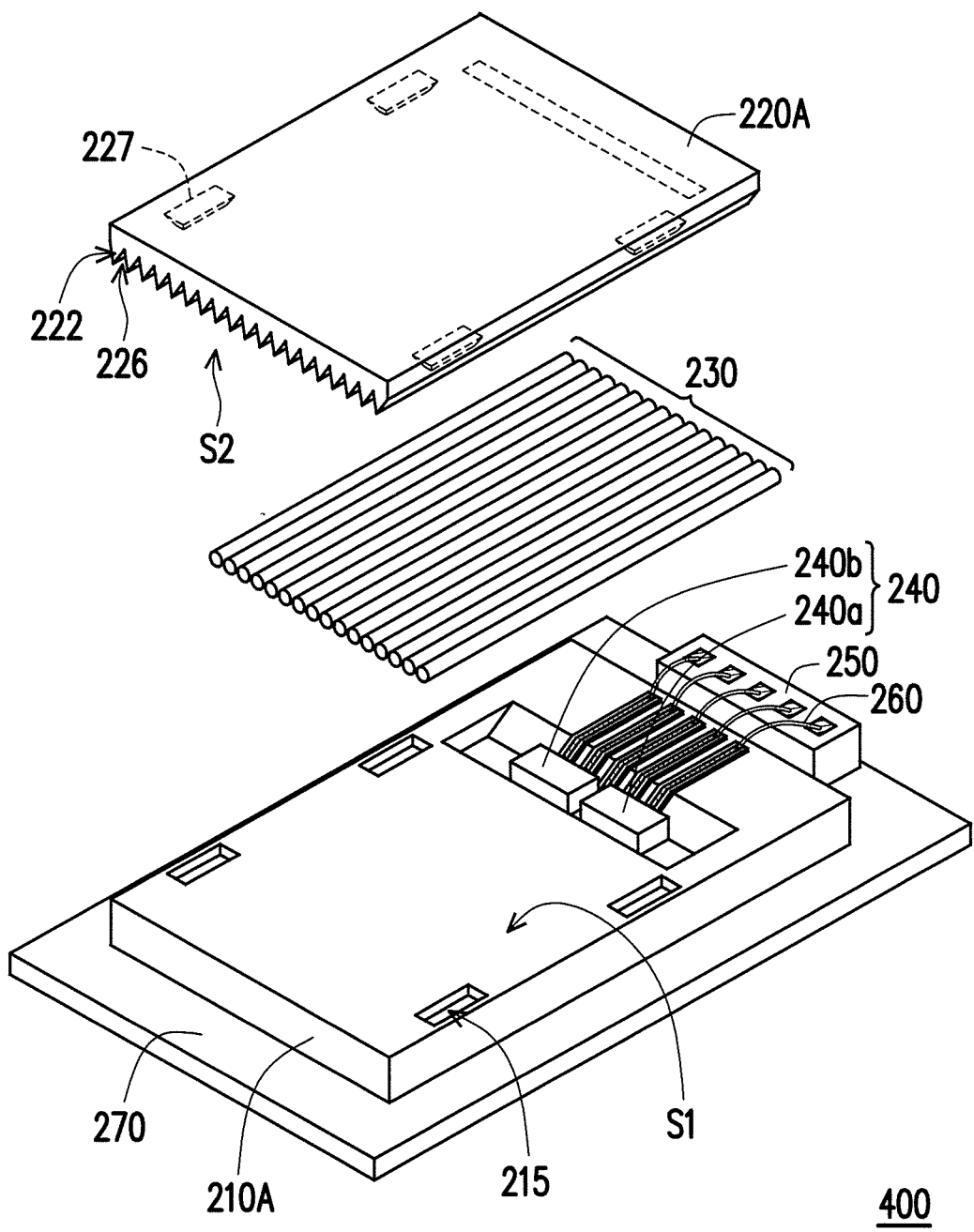
FIG. 9A is a three-dimensional exploded view of an optical electrical module according to a second embodiment of the invention.
Figure 9B:
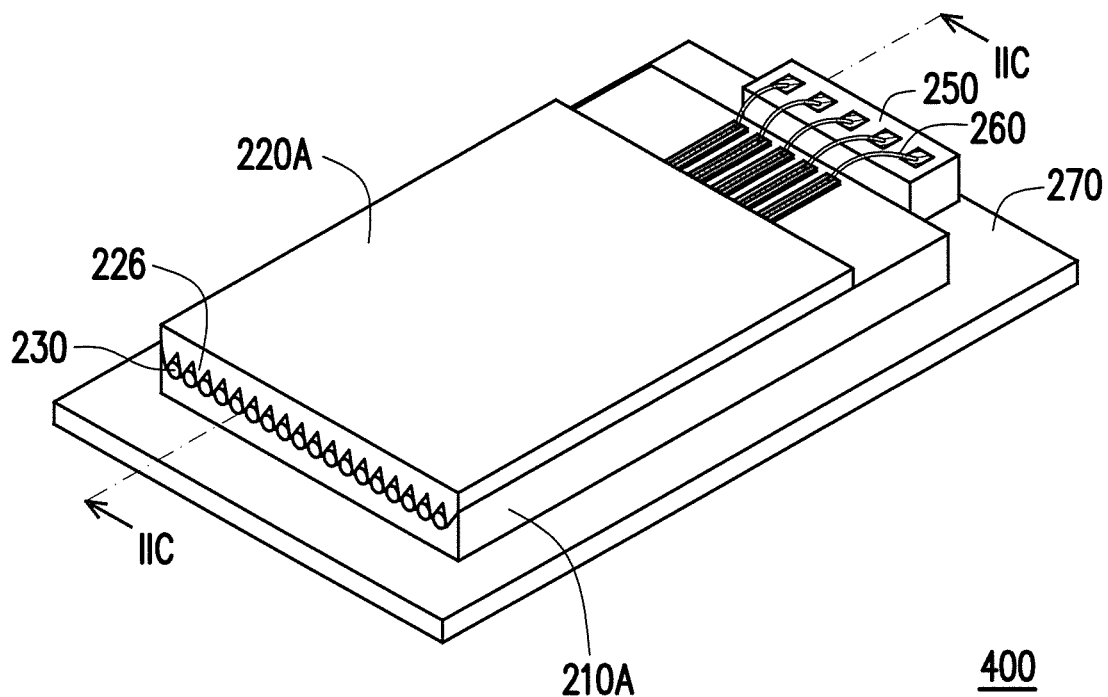
FIG. 9B is a three-dimensional combination view of the optical electrical module of FIG. 9A.
Figure 9C:
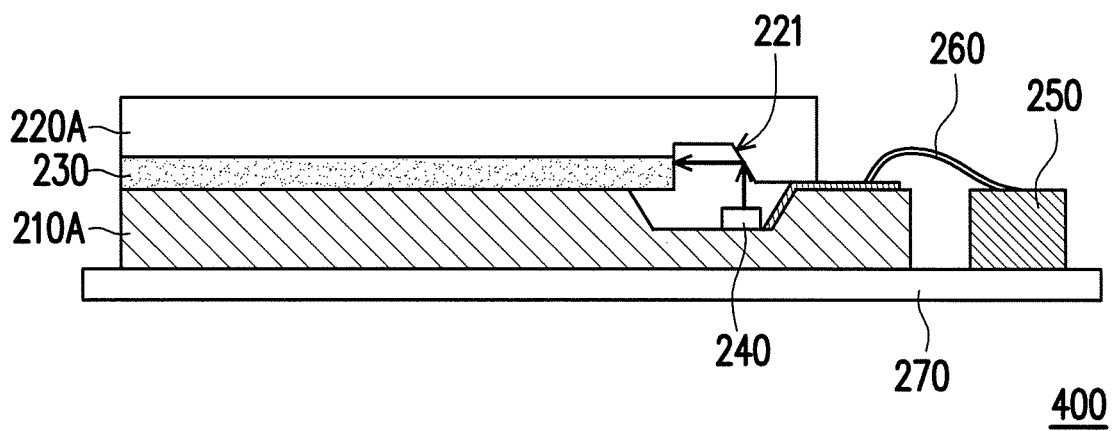
FIG. 9C is a cross-sectional view of the optical electrical module of FIG. 9B along a section line IIC.

FIG. 9A is a three-dimensional exploded view of an optical electrical module according to a second embodiment of the invention. FIG. 9B is a three-dimensional combination view of the optical electrical module of FIG. 9A. FIG. 9C is a cross-sectional view of the optical electrical module of FIG. 9B along a section line IIC. Referring to FIG. 9A to FIG. 9C, the optical electrical module 400 of the present embodiment is similar to the optical electrical module 200 of the first embodiment, and the same elements are denoted by the same referential number, and a main difference there between is that in the optical electrical module 400 of the present embodiment, the first substrate 210A has at least one first positioning portion 215. The second substrate 220A has at least one second positioning portion 227. The first positioning portion 215 and the second positioning portion 227 are combined to fix the light guide elements 230 between the first substrate 210A and the second substrate 220A. Based on a design of the first positioning portion 215 and the second positioning portion 227, the first substrate 210A can be easily aligned to the second substrate 220A, and process robustness of the optical electrical module 400 can be improved and the fabrication cost thereof can be reduced. The differences of the optical electrical modules 400 and 200 are described in detail below, and the same parts are not repeated.

Referring to FIG. 9A to FIG. 9C, the optical electrical module 400 of the present embodiment further has an effect of fixing the light guide elements 230. In the present embodiment, the light guide element 230 can be an optical fiber or waveguide. To facilitate descriptions, in the present embodiment, a plurality of optical fibers is used to represent the light guide elements 230. The optical electrical module 400 includes the first substrate 210A and the second substrate 220A. The optical electrical module 400 can be disposed on a substrate, where the substrate is, for example, a circuit board 270. In the present embodiment, the first substrate 210A is used to carry the optical electrical element 240, and the second substrate 220A can be a cover used to fix the light guide elements 230. In the present embodiment, the optical electrical element 240 includes a light receiving element 240a and a light-emitting element 240b.

The first substrate 210A of the present embodiment has a carrying surface S1 and the first positioning portions 215 disposed on the carrying surface S1. The second substrate 220A has an inner surface S2 and the second positioning portions 227 disposed on the inner surface S2. The second substrate 220A further has positioning structures 226 used for accommodating the light guide elements 230 and the reflective surface 221 (shown in FIG. 9C). The reflective surface 221 of the present embodiment may have a diffractive optical element (DOE) or can be a planar reflective surface. The first positioning portion 215 is used to combine with the second positioning portion 227, so that the first substrate 210A and the second substrate 220A are precisely combined, and the carrying surface S1 of the first substrate 220A fixes the light guide elements 230 in the positioning structures 226 of the second substrate 220A.

In the present embodiment, the first positioning portion 215 can be a bump, and the second positioning portion can be a groove, though the invention is not limited thereto. Moreover, it should be noticed that four first positioning portions 215 and four second positioning portions 227 of FIG. 9A are taken as an example for descriptions. However, the numbers of the first positioning portion 215 and the second positioning portion 227 are not limited by the invention, which can be suitably adjusted according to an actual design requirement. A diameter of the light guide element 230 is, for example, 125 μm, and a depth of the positioning structure 226 is between 50 μm and 200 μm. The carrying surface S1 of the first substrate 210A can be a plane or a concave and convex surface designed in collaboration with the positioning structures 226 of the second substrate 220A. The carrying surface S1 can fix the light guide elements 230 in the positioning structures 226 of the second substrate 220A through a pressing manner. For example, if the light guide element 230 protrudes out from the positioning structure 226, the inner surface S2 can be a concave and convex surface, and positions of the positioning structures 226 on the inner surface S2 correspond to positions of the light guide elements 230. The carrying surface S1 and the positioning structures 226 work together to fix the light guide elements 230 in the optical electrical module 400.

In the present embodiment, a material of the first substrate 210A can be a semiconductor. Further, the material of the first substrate 210A is, for example, silicon. A material of the second substrate 220A can be a semiconductor, plastic, glass and ceramics or a group formed by at least two of the above materials. If the material of the second substrate 220A is plastic, the second positioning portions 227 can be formed through injection molding. In another embodiment of the invention, the first substrate 210A and the second substrate 220A can be formed by polysilicon, where the first positioning portions 215 of the first substrate 210A, the second positioning portions 227 of the second substrate 220A and the reflective surface 221 can all be formed through an etching process (for example, wet etching).

Figure 9D:
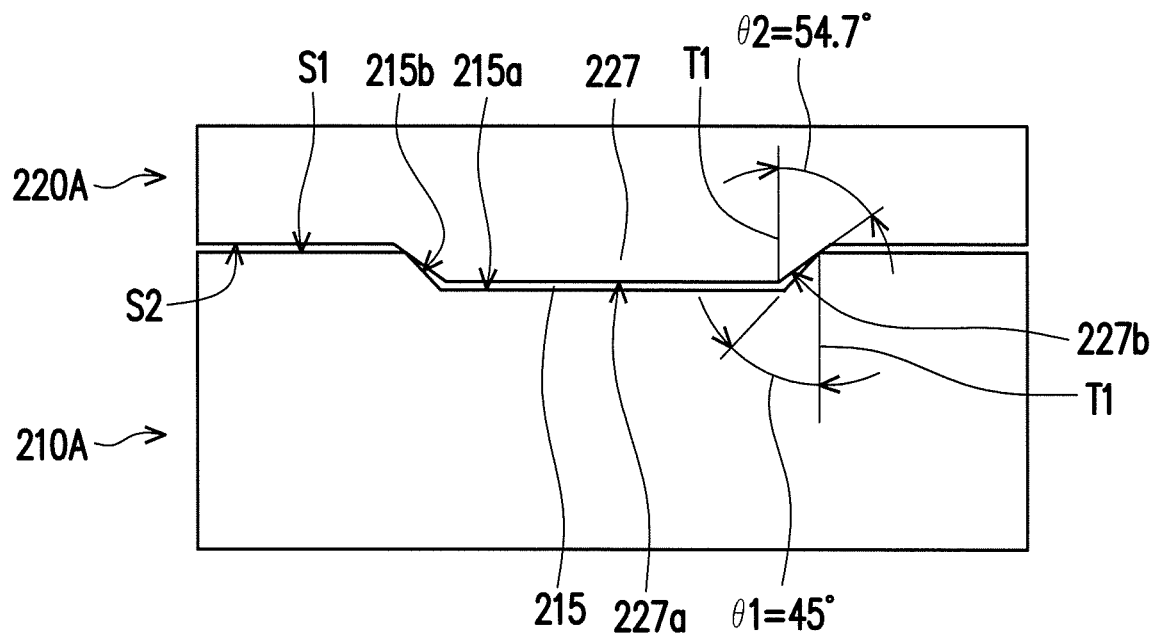
FIG. 9D is an enlarged cross-sectional view of a first positioning portion and a second positioning portion of FIG. 9B.

FIG. 9D is an enlarged cross-sectional view of the first positioning portion and the second positioning portion of FIG. 9B. Referring to FIG. 9D, the first positioning portion 215 has a bottom surface 215a and at least one groove side surface 215b. The second positioning portion 227 has a top surface 227a and at least one bump side surface 227b. The bottom surface 215a faces the top surface 227a. An included angle θ1 between the groove side surface 215b and a vertical plane T1 is not equal to an included angle θ2 between the bump side surface 227b and the vertical plane T1. The vertical plane T1 is substantially perpendicular to the bottom surface 215a and the top surface 227a. In detail, the included angle θ2 is substantially greater than or smaller than the included angle θ1, so that the second positioning portion 227 is tightly engaged to the first positioning portion 215. In the present embodiment, the included angle θ1 is, for example, 45 degrees, and the included angle θ2 is, for example, 54.7 degrees.

When the first substrate 210A and the second substrate 220A of the present embodiment are all formed by a polysilicon material, since the polysilicon has a face-centered cubic (FCC) lattice structure, the second positioning portion 227 fabricated through the etching process can be formed by intersecting a <111> lattice plane and a <100> lattice plane. Substantially, the included angle θ2 between the <111> lattice plane and the <100> lattice plane is substantially 54.7 degrees. The first positioning portion 215 fabricated through the etching process can be formed by intersecting a <110> lattice plane and the <100> lattice plane. Substantially, the included angle θ1 between the <110> lattice plane and the <100> lattice plane is substantially 45 degrees.

Figure 10:
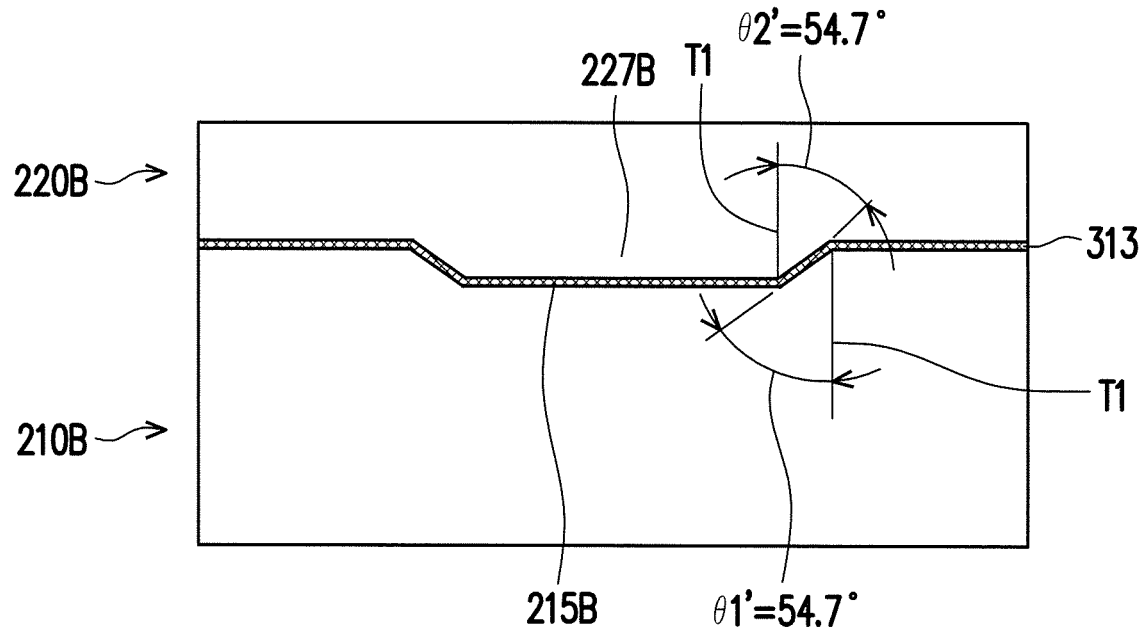
FIG. 10 is an enlarged cross-sectional view of a first positioning portion and a second positioning portion of an optical electrical module according to another embodiment of the invention.

FIG. 10 is an enlarged cross-sectional view of the first positioning portion and the second positioning portion of the optical electrical module according to another embodiment of the invention. Referring to FIG. 10, in another embodiment of the invention, an included angle θ2' is substantially smaller than an included angle θ1'. A second positioning portion 227B of a second substrate 220B can be formed by intersecting the <110> lattice plane and the <100> lattice plane. The included angle θ2' between the <110> lattice plane and the <100> lattice plane is substantially 45 degrees. A first positioning portion 215B of a first substrate 210B can be formed by intersecting a <111> lattice plane and the <100> lattice plane. The included angle θ1' between the <111> lattice plane and the <100> lattice plane is substantially 54.7 degrees. Particularly, in order to closely combine the first substrate 210B and the second substrate 220B, a glue material 313 can be filled between the first substrate 210B and the second substrate 220B. The glue material 313 is, for example, a silicon based glue, an UV glue, an epoxy resin glue or other suitable materials.

Figure 11:
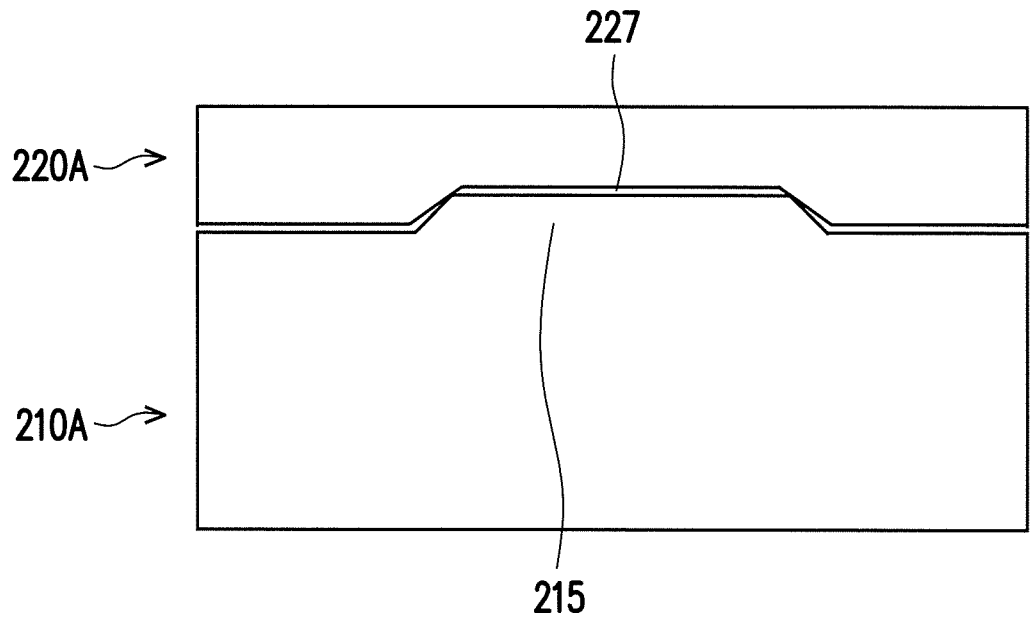
FIG. 11 is an enlarged cross-sectional view of a first positioning portion and a second positioning portion of an optical electrical module according to still another embodiment of the invention.

FIG. 11 is an enlarged cross-sectional view of the first positioning portion and the second positioning portion of an optical electrical module according to still another embodiment of the invention. In FIG. 9A to FIG. 9D, the first positioning portion 215 is a groove, and the second positioning portion 227 is a bump. However, the invention is not limited thereto. In the embodiment of FIG. 11, the first positioning portion 215 is a bump and the second positioning portion 227 is a groove.

In the above embodiments, if the substrate (e.g. the first substrate or the second substrate) is made of silicon, such as a (100) silicon wafer. When patterning the silicon substrate to form the reflective surface used for transmitting light signal to the optical fiber or for transmitting light signal to the light-receiving element, it is difficult to control the etching rates of the side etching and the under etching of the silicon substrate due to different lattice planes, such as <100>, <110> and <111> lattice planes, of the silicon substrate have different etching rates. Therefore, it is difficult to control the inclination angle of the reflective surface within a predetermined angle range in the conventional technique, which results in loss of optical power, thereby reducing the yield of the optical electrical module. The following manufacturing method can well control the inclination angle of the reflecting surface fall within the predetermined angle range and will advance the alignment process to improve yield and reduce cost of the optical electrical module.

Figure 12:
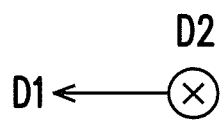
FIG. 12 is a partial cross-sectional schematic diagram, illustrating an optical electrical module according to an embodiment of the invention.
Figure 12:
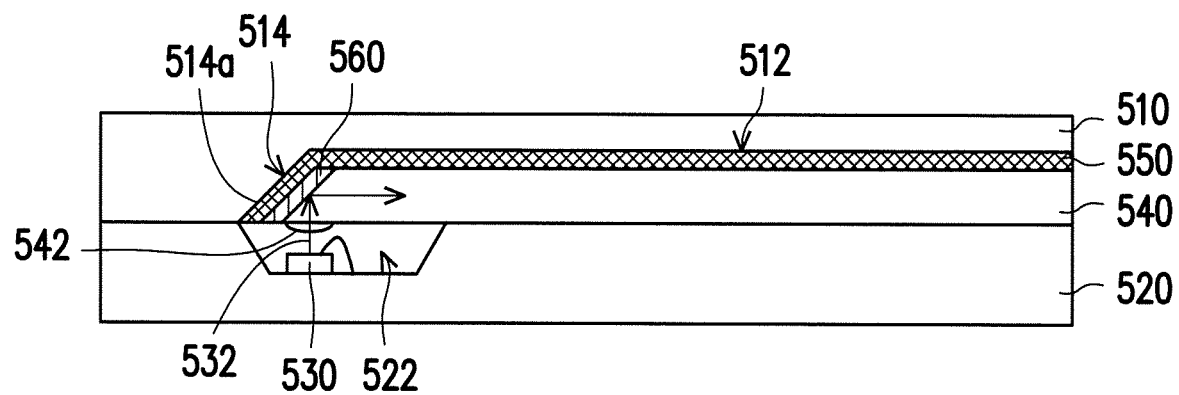
Figure 13:
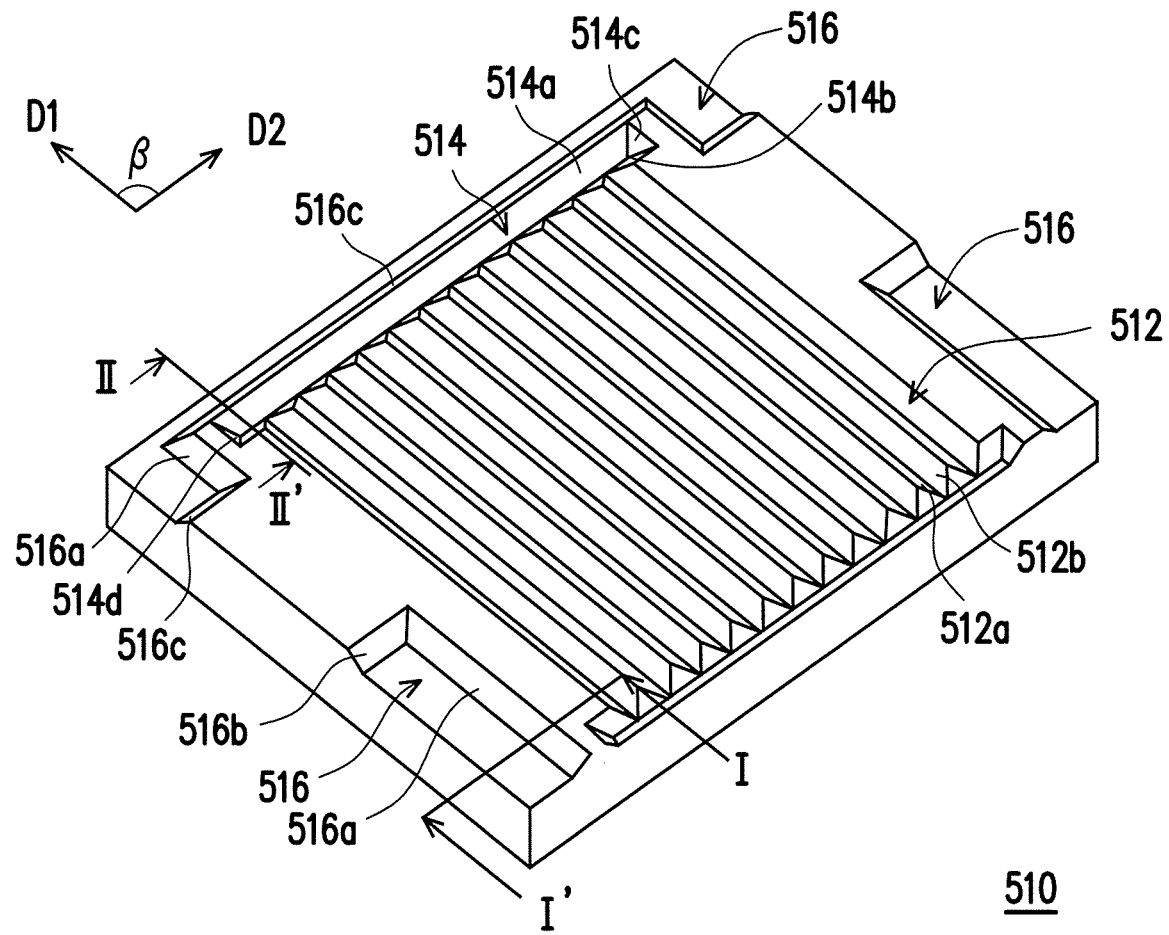
FIG. 13 is a top schematic diagram, illustrating a first substrate of the optical electrical module according to the embodiment of the invention.
Figure 14A:
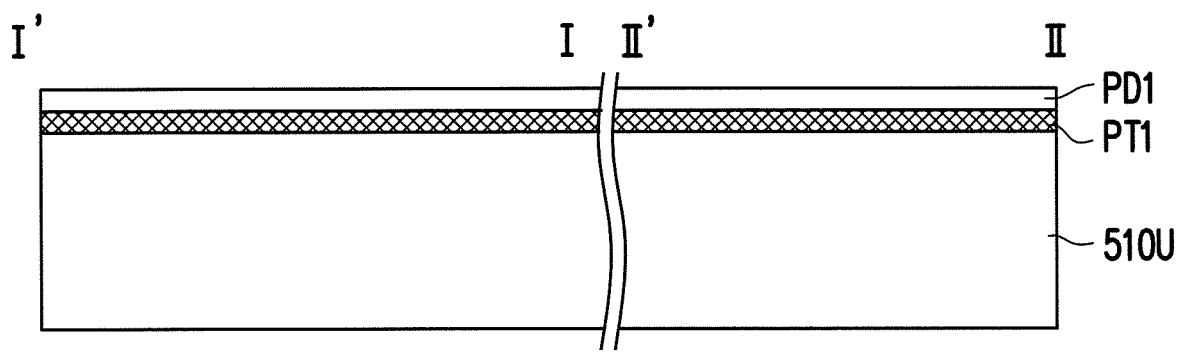
FIG. 14A to FIG. 14F are partial cross-sectional schematic diagrams, illustrating a manufacturing process of the first substrate in FIG. 13.
Figure 16:
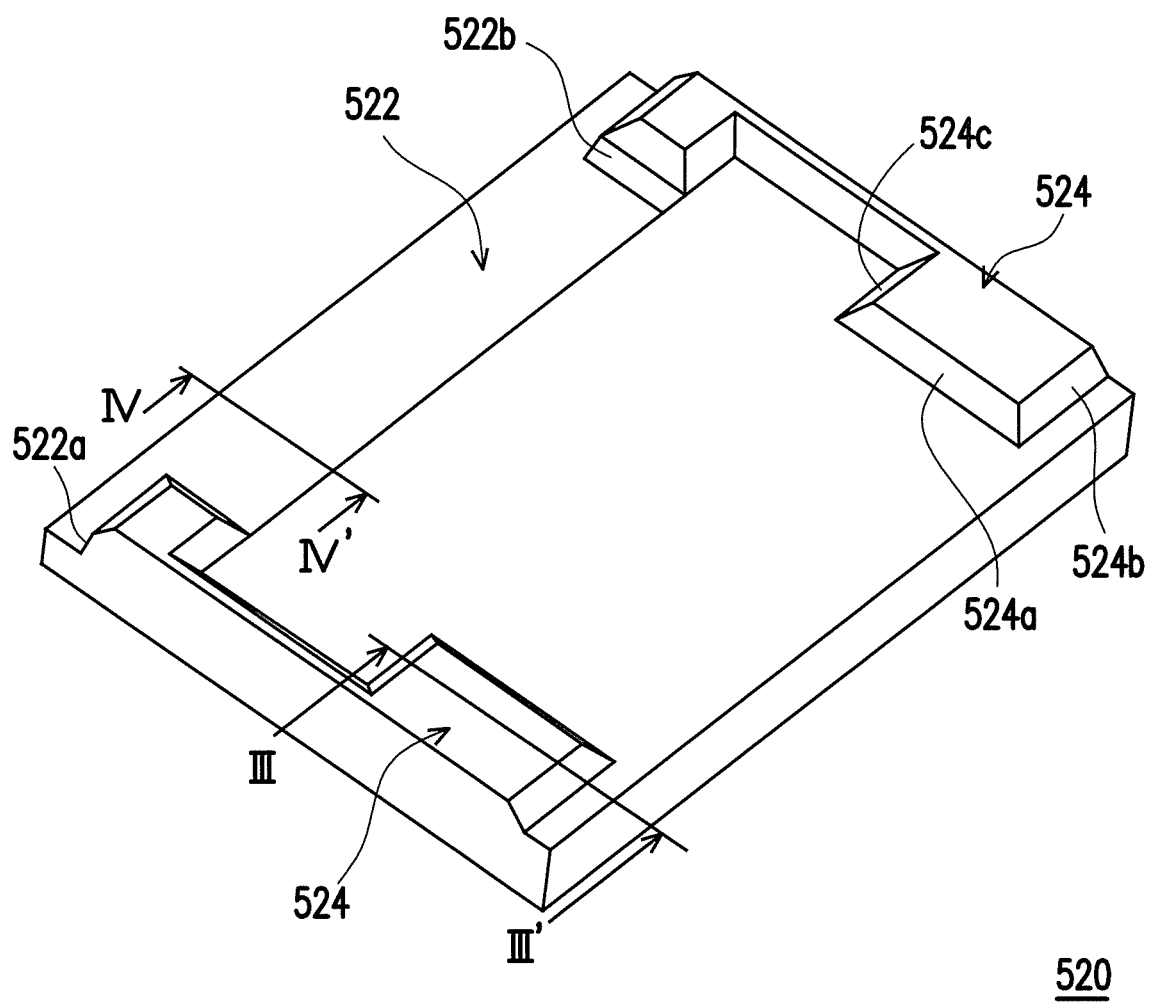
FIG. 16 is a top schematic diagram, illustrating a second substrate of the optical electrical module according to the embodiment of the invention.
Figure 17A:
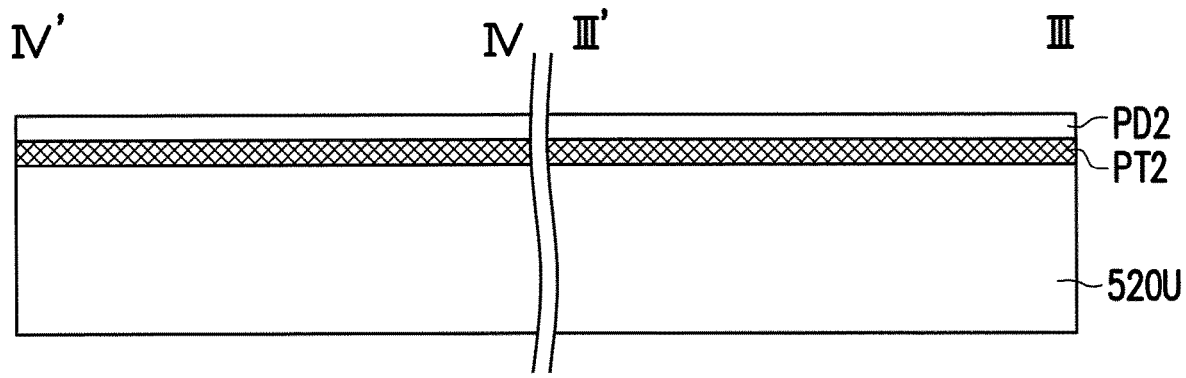
FIG. 17A to FIG. 17I are partial cross-sectional schematic diagrams, illustrating a manufacturing process of the second substrate in FIG. 16.

FIG. 12 is a partial cross-sectional schematic diagram, illustrating an optical electrical module according to an embodiment of the invention. FIG. 13 is a top schematic diagram, similar to FIG. 5, illustrating a first substrate of the optical electrical module according to the embodiment of the invention. In order to clearly show each surface of the first substrate, layers that are disposed on the first substrate (such as a protective layer and a reflective layer) are omitted in FIG. 13. FIG. 14A to FIG. 14F are partial cross-sectional schematic diagrams, illustrating a manufacturing process of the first substrate in FIG. 13. FIG. 15 is a top schematic diagram, illustrating a first mask disposed over the first substrate to be processed. FIG. 16 is a top schematic diagram, similar to FIG. 4, illustrating a second substrate of the optical electrical module according to the embodiment of the invention. FIG. 17A to FIG. 17I are partial cross-sectional schematic diagrams, illustrating a manufacturing process of the second substrate in FIG. 16. FIG. 18 is a top schematic diagram, illustrating a second mask disposed over the second substrate to be processed.

Referring to FIGS. 12, 13 and 16, an optical electrical module 500 of the embodiment is, for example, adapted to provide light signals and includes a first substrate 510, a second substrate 520, a plurality of optical electrical elements 530 and a plurality of light guide elements 540 (FIG. 12 schematically depicts one optical electrical element 530 and one light guide element 540). The end of light guide elements 540 may be inclined surface as showing in FIG. 7 and FIG. 11, and in other embodiment, the end of light guide elements 540 may be vertical surface perpendicular to the first direction D1 as showing in FIG. 3A and FIG. 8.

The first substrate 510 includes a plurality of accommodating grooves 512 and a reflective groove 514 connected with the accommodating grooves 512. The accommodating grooves 512 respectively parallel to each other and extend along the first direction D1, and each of the accommodating grooves 512 is adapted to accommodate one of the light guide elements 540. Specifically, each of the light guide elements 540 is adapted to lean against side walls 512a and 512b of one of the accommodating grooves 512. In the embodiment, each of the accommodating grooves 512 is, for example, a v-groove. However, the invention is not limited thereto.

The reflective groove 514 extends along a second direction D2 perpendicular to the first direction D1. Taking into account the process tolerances, "the second direction D2 perpendicular to the first direction D1" herein refers to an angle β between the first direction D1 and the second direction D2 is 90°±2°. In the embodiment, the reflective groove 514 is, for example, a trapezoidal groove. However, the invention is not limited thereto.

In the embodiment, the first substrate 510 may further include a plurality of alignment grooves 516 used for alignment with the second substrate 520. The alignment grooves 516 are, for example, located at the periphery of the first substrate 510. However, the number and the arrangement of the alignment grooves 516 may be adjusted according to design requirement and are not limited to those shown in FIG. 13.

A method for manufacturing the first substrate 510 will be described below with reference to FIG. 14A to FIG. 15. Referring to FIG. 14A, a protective layer PT1 and a pattern defining layer PD1 are formed in sequence on the first substrate to be processed (hereinafter, "unpatterned first substrate 510U"). The protective layer PT1 may be an oxide layer or a nitride layer, and the pattern defining layer PD1 may be a photoresist layer, for example. However, the invention is not limited thereto. The unpatterned first substrate 510U may be a (100) silicon wafer and includes a primary flat PF1 (shown in FIG. 15).

Figure 14B:
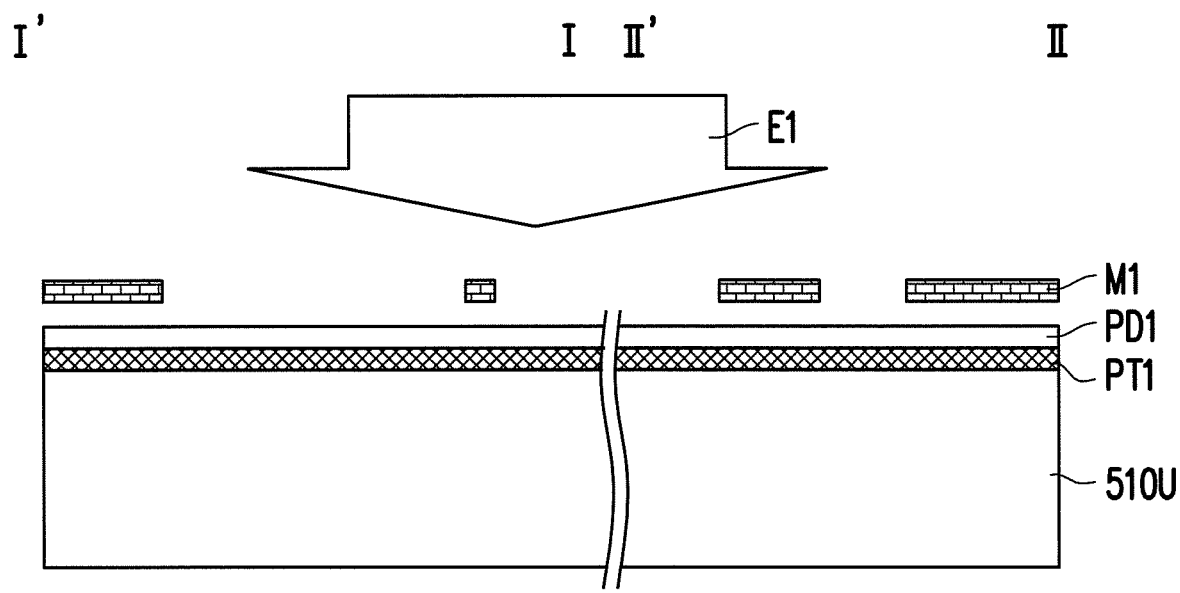
Figure 14C:
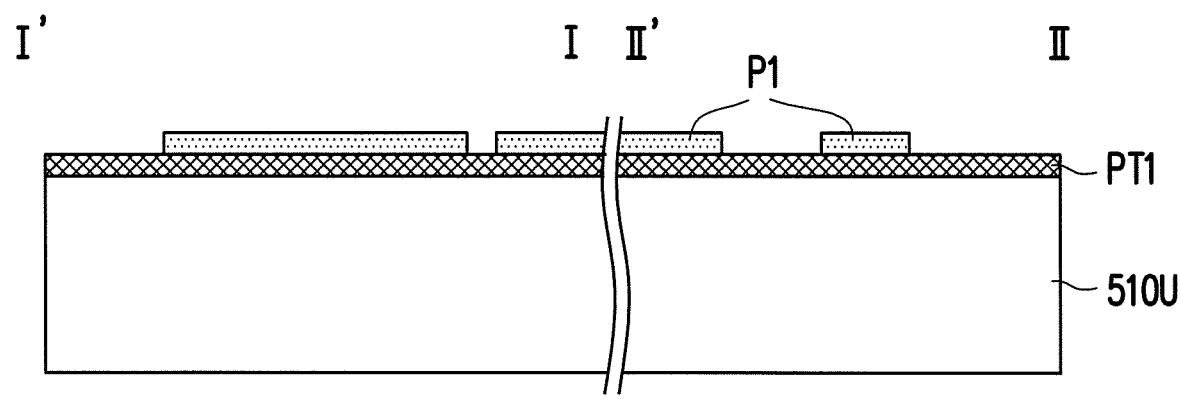
Figure 15:
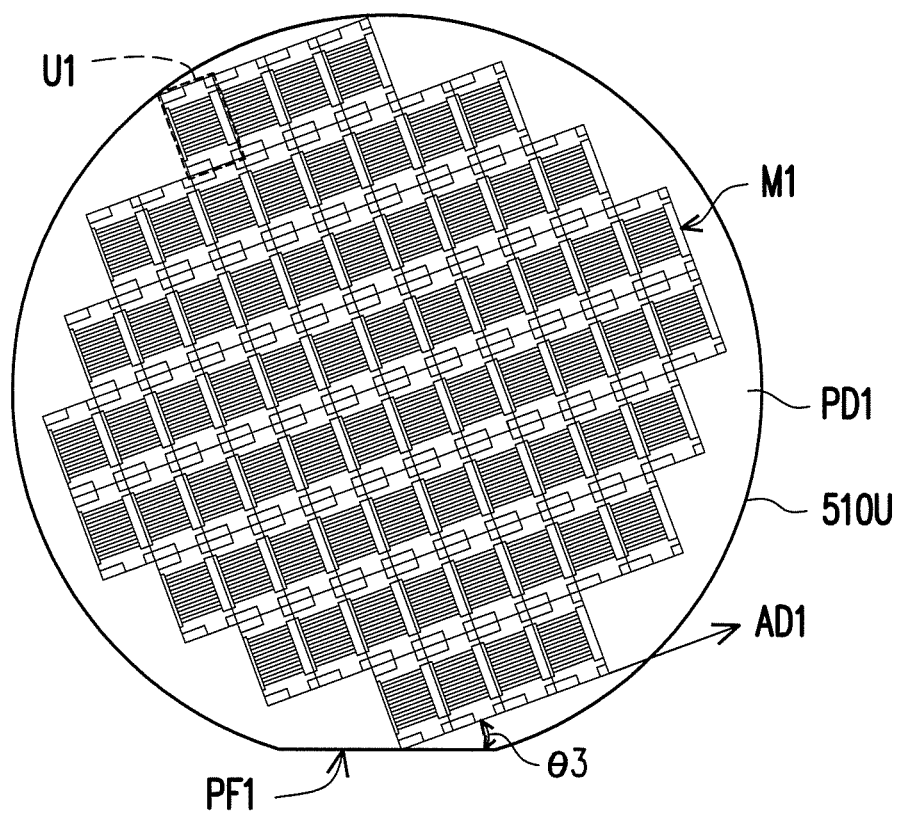
FIG. 15 is a top schematic diagram, illustrating a first mask disposed over the first substrate to be processed.

Referring to FIG. 14B and FIG. 15, a first mask M1 is disposed over the unpatterned first substrate 510U, wherein the protective layer PT1 and the pattern defining layer PD1 are located between the first mask M1 and the unpatterned first substrate 510U. The first mask M1 is, for example, a photo mask and includes a plurality of first pattern units U1 for defining a plurality of first patterns P1 to be formed later (as shown in FIG. 14C). One of the unpatterned first substrate 510U and the first mask M1 is rotated by an angle relative to the other, so that an angle θ3 between the primary flat PF1 of the unpatterned first substrate 510U and an arrangement direction AD1 having a maximum number of the first pattern units U1 of the first mask M1 is (θ+90°*n), wherein θ is between 22° to 39°, and n is an integer. For example, the θ may be 30°, and the angle θ3 between the primary flat PF1 and the arrangement direction AD1 may be 30°, 30°+90° (i.e. 120°), 30°+180° (i.e. 210°) or 30°+270° (i.e. 300°). However, the invention is not limited thereto. Then, an exposure process E1 is performed to transfer the pattern of the first pattern units U1 of the first mask M1 to the pattern defining layer PD1 located on the unpatterned first substrate 510U.

Referring to FIG. 14C, a developing process is performed to remove portions of the pattern defining layer PD1 which were not exposed in the exposure process E1 shown in FIG. 14B, so that the first patterns P1 are formed on the unpatterned first substrate 510U.

Figure 14D:
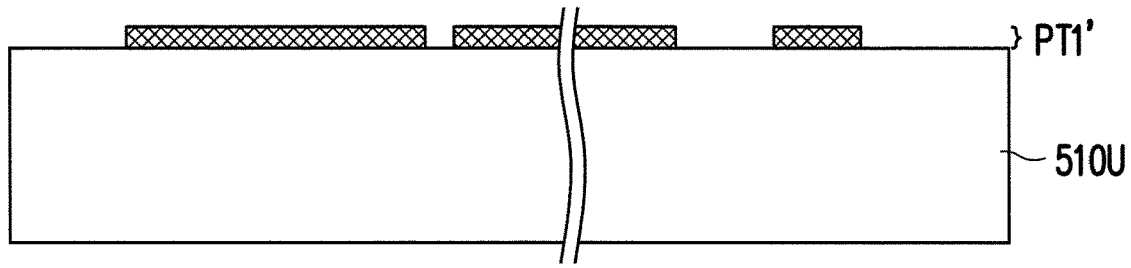
Figure 14E:
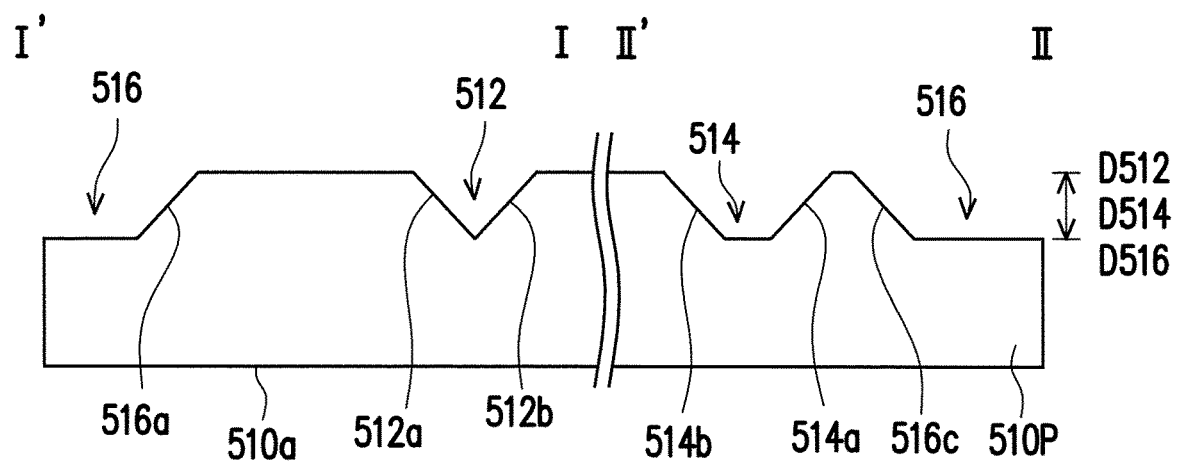

Then, the unpatterned first substrate 510U is subjected to a first patterning process using the first patterns P1 as a mask to form the accommodating grooves 512, the reflective groove 514 and the alignment grooves 516. Specifically, referring to FIGS. 14C and 14D, the first patterns P1 are used as a mask to pattern the protective layer PT1, so that a patterned protective layer PT1' is formed. Referring to FIGS. 14D and 14E, the patterned protective layer PT1' is then used as a mask to pattern the unpatterned first substrate 510U, so that the accommodating grooves 512, the reflective groove 514 and the alignment grooves 516 are formed simultaneously in a patterned first substrate 510P. In the embodiment, a method for patterning the unpatterned first substrate 510U may include anisotropic wet etching. Specifically, an etching rate between a side etching and an under etching is between 1:2 and 1:20 when patterning the unpatterned first substrate 510U. In addition, an etching solution for patterning the unpatterned first substrate 510U may include potassium hydroxide, isopropyl alcohol, $H_2O$, inhibitors, tetramethylammonium hydroxide and methyl alcohol. Moreover, the process temperature for etching the unpatterned first substrate 510U is preferably greater than 50° C. However, the invention is not limited to the above.

After the patterned first substrate 510P including the accommodating grooves 512, the reflective groove 514 and the alignment grooves 516 is formed, the patterned first substrate 510P may be sliced to form a plurality of first substrates 510 as shown in FIG. 13 at the same time.

Figure 14F:
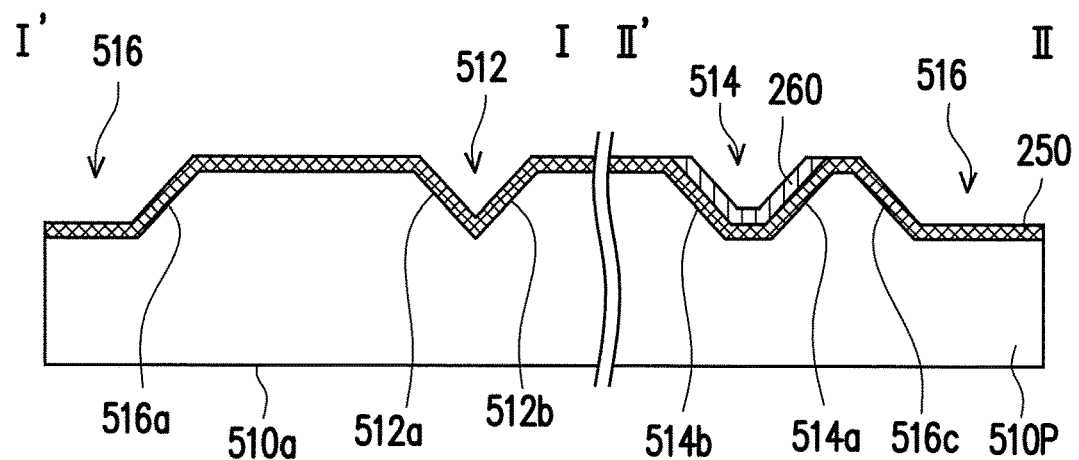

In the embodiment, before the slice process, referring to FIG. 14F, a protective layer 550 may be further formed on the patterned first substrate 510P, and a reflective layer 560 may be further formed on the protective layer 550. The protective layer 550 may be an oxide layer or a nitride layer, for example. However, the invention is not limited thereto. The reflective layer 560 at least covers the side wall 514a of the reflective grooves 514, such that more light signals 532 may be transmitted to the light guide elements 540 through the side wall 514a. In the embodiment, the reflective layer 560 covers the whole protective layer 550 located in the reflective grooves 514. However, the invention is not limited thereto.

In the manufacturing process of the first substrate 510, by rotating one of the unpatterned first substrate 510U and the first mask M1 at an angle relative to the other, it is possible to form grooves that are sufficiently deep and inclination angles of side walls of the grooves fall within a predetermined angle range. Specifically, referring to FIG. 14E and FIG. 13, a depth D512 of each of the accommodating grooves 512, a depth D514 of the reflective groove 514 and a depth D516 of each of the alignment grooves 516 are larger than 120 μm, respectively. The depth of D512, D514, and D516 may be substantially the same, or at least any two of them are substantially the same. In addition, side walls 512a and 512b of the accommodating grooves 512, side walls 514a, 514b, 514c and 514d of the reflective groove 514 and side walls 516a, 516b and 516c of the alignment grooves 516 are respectively inclined surfaces of 42° to 49°. Herein, "the inclined surfaces of 42° to 49°" refers to an angle sandwiched between the bottom surface 510a of the patterned first substrate 510P and an extension surface of each of the inclined surfaces is between 42° to 49°. Referring to FIG. 12 and FIG. 13, the side wall 514a of the reflective groove 514 is used for reflecting the light signal 532 output from each of the optical electrical elements 530 and transmitting the light signal 532 to the corresponding light guide element 540. Since the inclination angle of the side wall 514a of the reflective groove 514 falls within the predetermined angle range (42° to 49°), the optical power loss due to incorrect tilt angle of the reflective surface in the conventional technique can be improved. Moreover, since the accommodating grooves 512 and the reflective groove 514 are formed simultaneously, the angle between the accommodating grooves 512 and the reflective groove 514 (i.e. the angle β between the first direction D1 and the second direction D2) can be controlled within 90°±2°.

Referring to FIG. 16, the second substrate 520 includes an accommodating cavity 522 adapted to accommodate the optical electrical elements 530. In the embodiment, the second substrate 520 may further include a plurality of alignment bumps 524 to be engaged with the alignment grooves 516 when the first substrate 510 and the second substrate 520 are bonded with each other. The alignment bumps 524 are, for example, located at the periphery of the second substrate 520. However, the number and the arrangement of the alignment bumps 524 may be adjusted according to design requirement and are not limited to those shown in FIG. 16.

A method for manufacturing the second substrate 520 will be described below with reference to FIG. 17A to FIG. 18. Referring to FIG. 17A, a protective layer PT2 and a pattern defining layer PD2 are formed in sequence on the second substrate to be processed (hereinafter, "unpatterned second substrate 520U"). The protective layer PT2 may be an oxide layer or a nitride layer, and the pattern defining layer PD2 may be a photoresist layer, for example. However, the invention is not limited thereto. The unpatterned second substrate 520U may be a (100) silicon wafer and includes a primary flat PF2 (shown in FIG. 18).

Figure 17B:
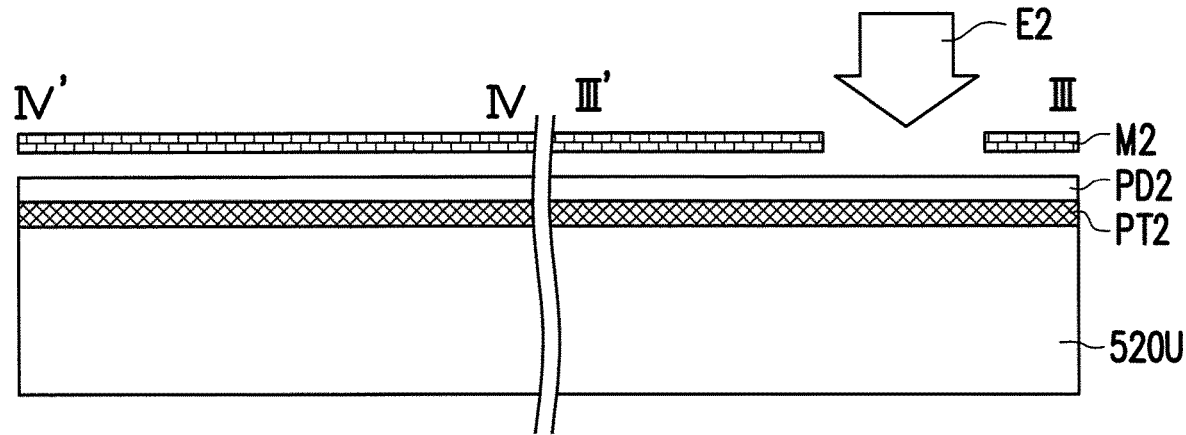
Figure 17C:
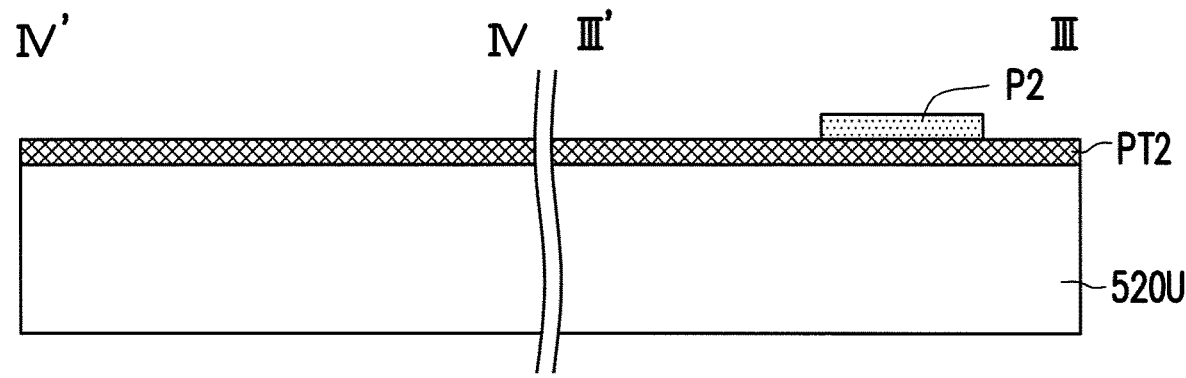
Figure 18:
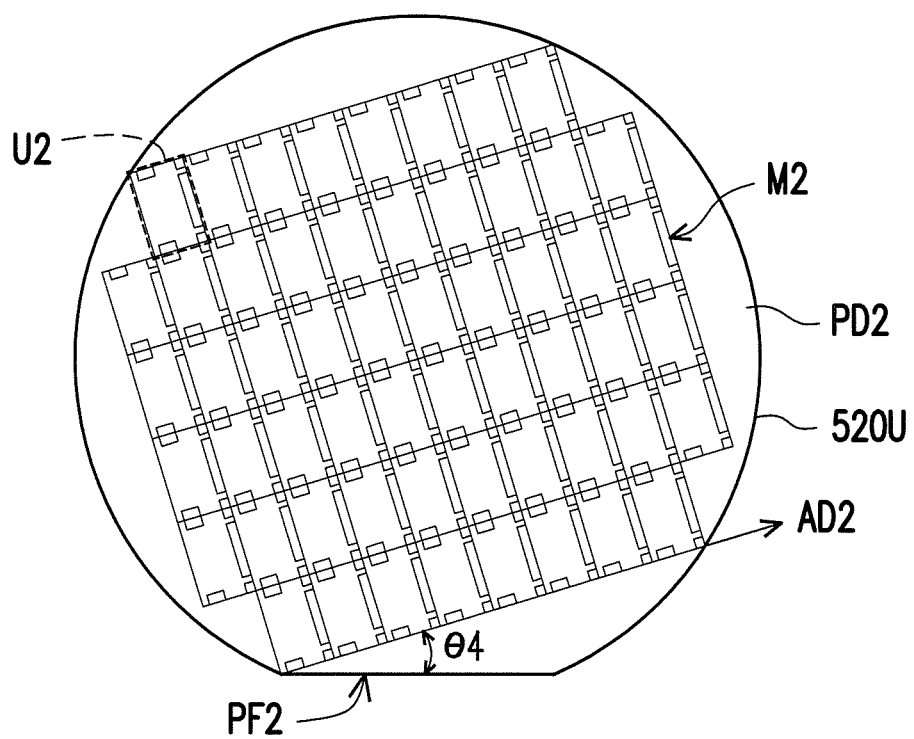
FIG. 18 is a top schematic diagram, illustrating a second mask disposed over the second substrate to be processed.

Referring to FIG. 17B and FIG. 18, a second mask M2 is disposed over the unpatterned second substrate 520U, wherein the protective layer PT2 and the pattern defining layer PD2 are located between the second mask M2 and the unpatterned second substrate 520U. The second mask M2 is, for example, a photo mask and includes a plurality of second pattern units U2 for defining a plurality of second patterns P2 to be formed later (FIG. 17C schematically depicts one second pattern P2). One of the unpatterned second substrate 520U and the second mask M2 is rotated by an angle relative to the other, so that an angle θ4 between the primary flat PF2 of the unpatterned second substrate 520U and an arrangement direction AD2 having a maximum number of the second pattern units U2 of the second mask M2 is (θ+90°*n), wherein θ is between 22° to 39°, and n is an integer. For example, the θ may be 30°, and the angle θ4 between the primary flat PF2 and the arrangement direction AD2 may be 30°, 30°+90° (i.e. 120°), 30°+180° (i.e. 210°) or 30°+270° (i.e. 300°). However, the invention is not limited thereto. Then, an exposure process E2 is performed to transfer the pattern of the second pattern units U2 of the second mask M2 to the pattern defining layer PD2 located on the unpatterned second substrate 520U.

Referring to FIG. 17C, a developing process is performed to remove portions of the pattern defining layer PD2 which were not exposed in the exposure process E2 shown in FIG. 17B, so that the second patterns P2 are formed on the unpatterned second substrate 520U.

Figure 17D:
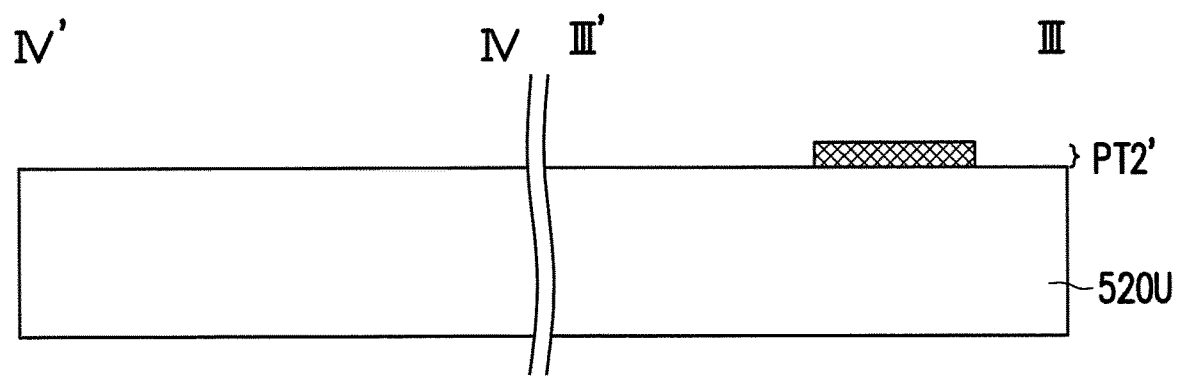
Figure 17E:
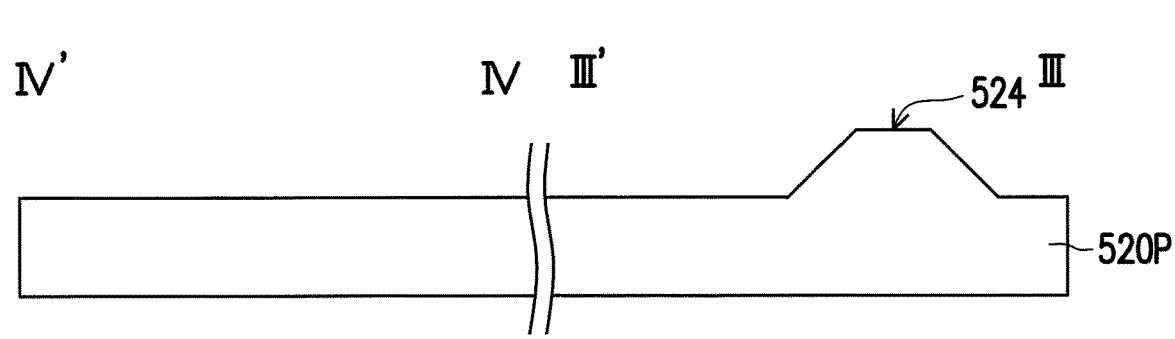

Then, the unpatterned second substrate 520U is subjected to a second patterning process using the second patterns P2 as a mask to form the alignment bumps 524. Specifically, referring to FIGS. 17C and 17D, the second patterns P2 are used as a mask to pattern the protective layer PT2, so that a patterned protective layer PT2' is formed. Referring to FIGS. 17D and 17E, the patterned protective layer PT2' is then used as a mask to pattern the unpatterned second substrate 520U, so that a patterned second substrate 520P including the alignment bumps 524 is formed (FIG. 17E schematically depicts one alignment bump 524). In the embodiment, a method for patterning the unpatterned second substrate 520U may include anisotropic wet etching. Specifically, an etching rate between a side etching and an under etching is between 1:2 and 1:20 when patterning the unpatterned second substrate 520U. In addition, an etching solution for patterning the unpatterned second substrate 520U may include potassium hydroxide, isopropyl alcohol, $H_2O$, inhibitors, tetramethylammonium hydroxide and methyl alcohol. Moreover, the process temperature for etching the unpatterned second substrate 520U is preferably greater than 50° C. However, the invention is not limited to the above.

After the alignment bumps 524 are formed, the accommodating cavities 522 can be formed in succession. Specifically, referring to FIG. 17F, a protective layer PT3 and a pattern defining layer PD3 are formed in sequence on the patterned second substrate 520P. The protective layer PT3 may be an oxide layer or a nitride layer, and the pattern defining layer PD3 may be a photoresist layer, for example. However, the invention is not limited thereto. Then, a third mask M3 is disposed over the patterned second substrate 520P, wherein the protective layer PT3 and the pattern defining layer PD3 are located between the third mask M3 and the patterned second substrate 520P. The third mask M3 is, for example, a photo mask and includes a plurality of third pattern units (not shown, refer to FIG. 18 for the arrangement) for defining a plurality of third patterns P3 to be formed later (FIG. 17G schematically depicts one third pattern P3). In the embodiment, one of the patterned second substrate 520P and the third mask M3 may be rotated by an angle relative to the other, so that an angle (not shown, similar to the angle θ4 of FIG. 9) between the primary flat PF2 (as shown in FIG. 18) of the patterned second substrate 520P and an arrangement direction (not shown, similar to the arrangement direction AD2 of FIG. 18) having a maximum number of the third pattern units of the third mask M3 is (θ+90°*n), wherein θ is between 22° to 39°, and n is an integer. For example, the θ may be 30°, and the angle between the primary flat PF2 of the patterned second substrate 520P and the arrangement direction having a maximum number of the third pattern units may be 30°, 30°+90° (i.e. 120°), 30°+180° (i.e. 210°) or 30°+270° (i.e. 300°). However, the invention is not limited thereto. Then, an exposure process E3 is performed to transfer the pattern of the third pattern units of the third mask M3 to the pattern defining layer PD3 located on the patterned second substrate 520P.

Figure 17F:
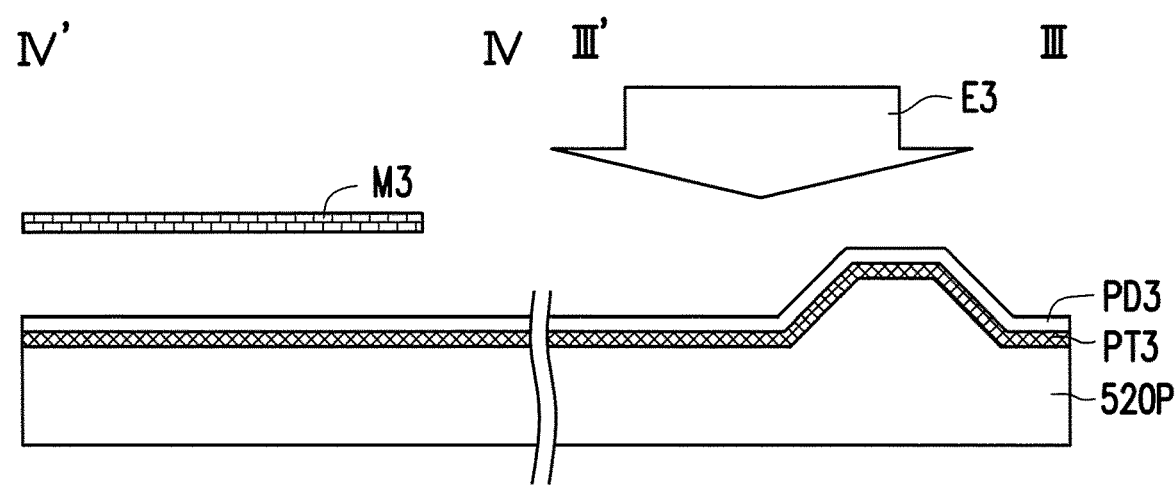
Figure 17G:
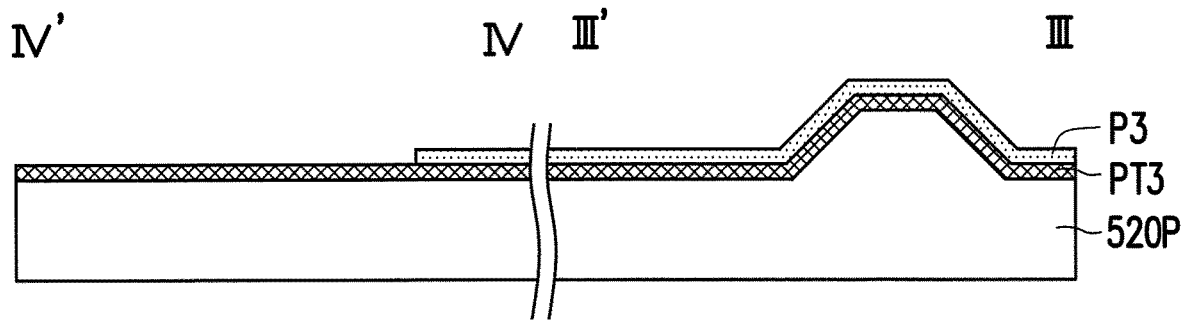

Referring to FIG. 17G, a developing process is performed to remove portions of the pattern defining layer PD3 which were not exposed in the exposure process E3 shown in FIG. 17F, so that the third patterns P3 are formed on the patterned second substrate 520P.

Figure 17H:
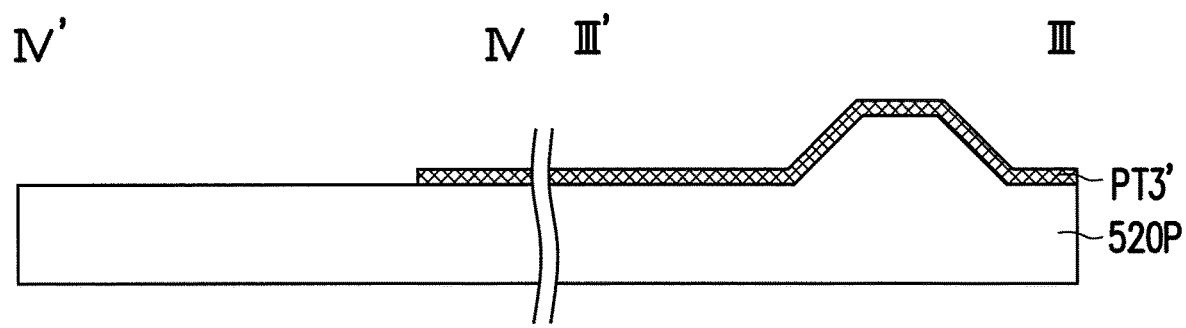
Figure 17I:
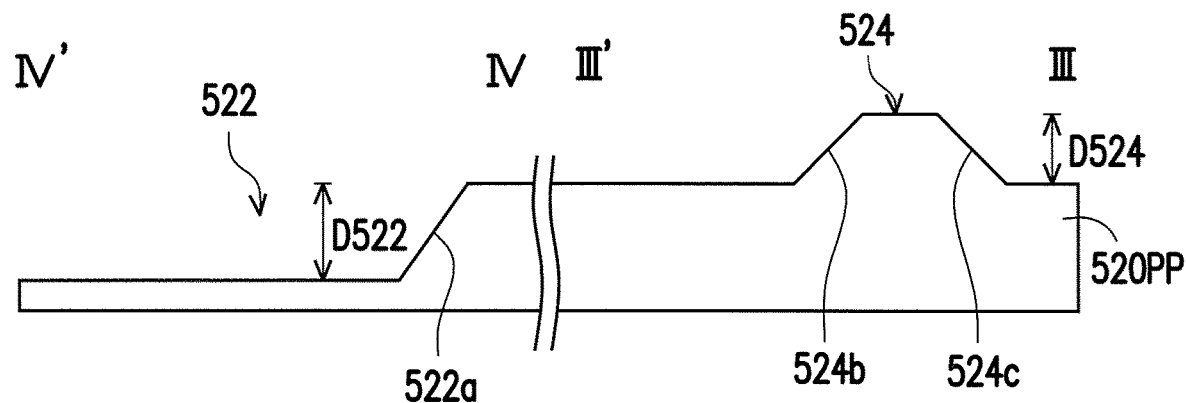

Then, the patterned second substrate 520P is subjected to a third patterning process using the third patterns P3 as a mask to form accommodating cavities 522. Specifically, referring to FIGS. 17G and 17H, the third patterns P3 are used as a mask to pattern the protective layer PT3, so that a patterned protective layer PT3' is formed. Referring to FIGS. 17H and 17I, the patterned protective layer PT3' is then used as a mask to pattern the patterned second substrate 520P, so that a patterned second substrate 520PP including the alignment bumps 524 and the accommodating cavities 522 is formed (FIG. 17I schematically depicts one alignment bump 524 and one accommodating cavity 522). The method for patterning the patterned second substrate 520P may be referred to above, and will not be described again. After the patterned second substrate 520PP including the alignment bumps 524 and the accommodating cavities 522 is formed, the patterned second substrate 520PP may be sliced to form a plurality of second substrates 520 as shown in FIG. 16 at the same time.

In the manufacturing process of the second substrate 520, by rotating one of the unpatterned second substrate 510U (or the patterned second substrate 510P) and the second mask M2 (or the third mask M3) at an angle relative to the other, it is possible to form grooves (or bumps) that are sufficiently deep (high) and inclination angles of side walls of the grooves (or bumps) fall within a predetermined angle range. Specifically, referring to FIG. 17I and FIG. 16, a depth D522 of the accommodating cavity 522 and a height D524 of each of the alignment bumps 524 are larger than 120 μm, respectively. In addition, side walls 522a and 522b of the accommodating cavity 522 and side walls 524a, 524b and 524c of the alignment bumps 524 are respectively inclined surfaces of 42° to 49°. Since the inclination angles of side walls 524a, 24b and 524c of the alignment bumps 524 are consistent with the inclination angles of side walls 516a, 516b and 516c of the alignment grooves 516, the alignment bumps 524 and the alignment grooves 516 can be well engaged with each other when the first substrate 510 and the second substrate 520 are bonded together. It is noted that, since the accommodating cavities 522 and the alignment bumps 524 are separately formed, the depth D522 of each of the accommodating cavities 522 and the height D524 of each of the alignment bumps 524 may not have to be the same.

Referring to FIG. 12, the optical electrical elements 530 (FIG. 12 schematically depicts one optical electrical element 530) are disposed in the accommodating cavity 522 after the patterning process of second substrate 520 is completed. The optical electrical elements 530 can be a laser or other suitable light-emitting elements, where the laser can be a vertical cavity surface emitting laser (VCSEL).

The light guide elements 540 (FIG. 12 schematically depicts one light guide element 540) are disposed in the accommodating grooves 512 after the patterning process of first substrate 510 is completed. The light guide elements 540 can respectively be an optical fiber or waveguide. In addition, a material of the light guide elements 540 can be polymer or a dielectric material. In the embodiment, each of the light guide elements 540 may contact the reflective layer 560. Namely, there is no space between the light guide elements 540 and the reflective layer 560. In another embodiment where the protective layer 550 and the reflective layer 560 are omitted, each of the light guide elements 540 may contact the side wall 514a of the reflective groove 514. Alternatively, a distance may be kept between the reflective layer 560 (or the side wall 514a of the reflective groove 514) and each of the light guide elements 540. Moreover, each of the light guide elements 540 may have a focusing portion 542. The focusing portion 542 is located between the reflective layer 560 and a corresponding optical electrical element 530. Besides, the focusing portion 542 is located on a transmission path of the light signal 532 output from the corresponding optical electrical element 530, so as to converge the light signal 532 on the reflective layer 560. Use of the focusing portion 542 can further improve a light coupling efficiency of the optical electrical module 500.

In an embodiment where the optical electrical module 500 is used for receiving the light signals transmitted by the light guide elements 540, the optical electrical elements 530 are replaced by light-receiving elements, and the focusing portion 542 is adapted to converge the light signal 532 from one of the light guide elements 540 to a corresponding light-receiving element.

In the embodiment, a surface contact area between the optical electrical element 530 and the second substrate 520 is large, so that the optical electrical element 530 can be stably fixed on the second substrate 520, which improves reliability of the optical electrical module 500. In addition, the first substrate 510 can be accurately and stably combined with the second substrate 520 by using the alignment grooves 516 and the alignment bumps 524, so as to improve the process efficiency of the optical electrical module 500 and decrease the fabrication cost thereof.

Figure 19A:
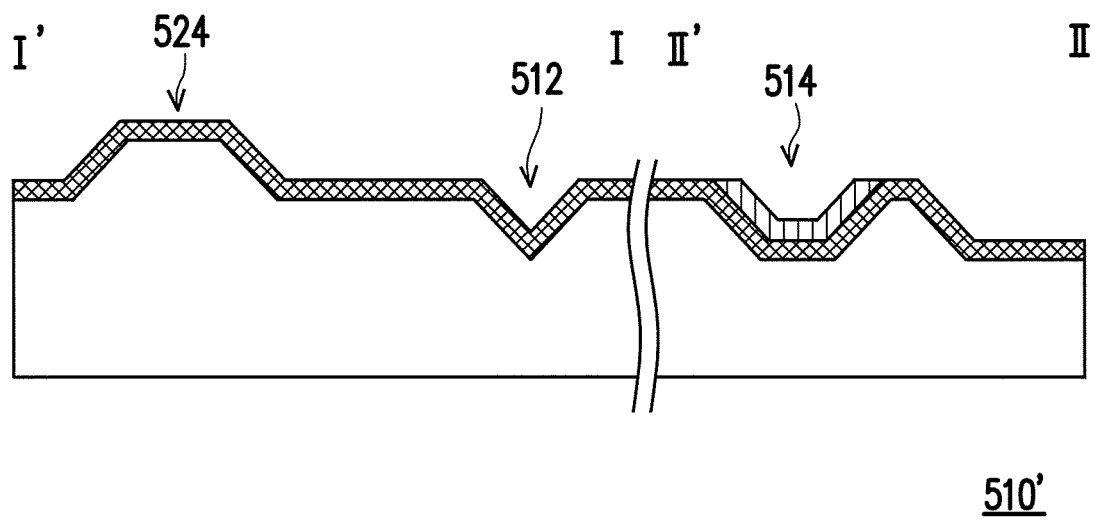
FIG. 19A is a partial cross-sectional schematic diagram, illustrating another first substrate of the optical electrical module according to the embodiment of the invention.
Figure 19B:
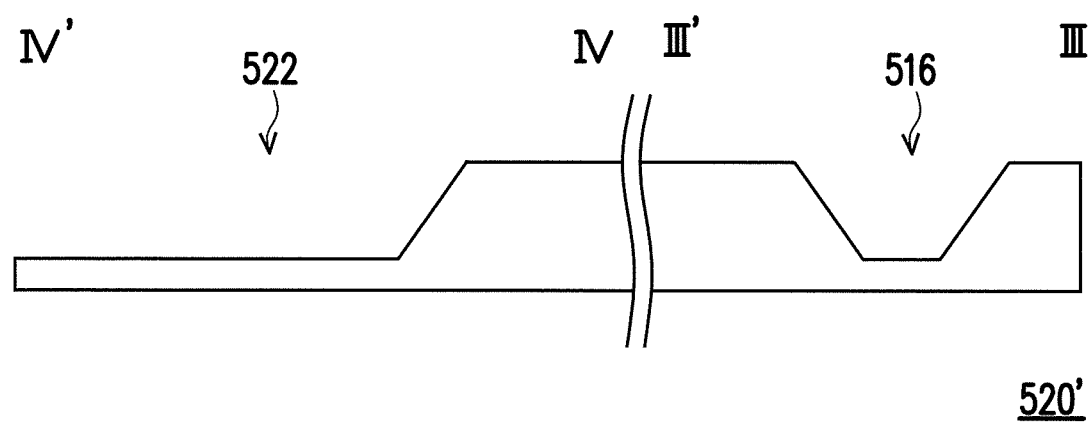
FIG. 19B is a partial cross-sectional schematic diagram, illustrating another second substrate of the optical electrical module according to the embodiment of the invention.

In the above embodiment, the alignment grooves 516 are formed in the first substrate 510 and the alignment bumps 524 are formed in the second substrate 520. However, the invention is not limited thereto. FIG. 19A is a partial cross-sectional schematic diagram, illustrating another first substrate of the optical electrical module according to the embodiment of the invention. FIG. 19B is a partial cross-sectional schematic diagram, illustrating another second substrate of the optical electrical module according to the embodiment of the invention.

Referring to FIG. 19A and FIG. 190B, the alignment grooves 516 are formed in the second substrate 520', and the alignment bumps 524 are forming in the first substrate 510'. A method for forming the accommodating cavities 522 and the alignment grooves 516 is similar to steps shown in FIG. 17A to FIG. 17I, the difference there between is that the formation of the alignment bumps 524 are omitted, and the accommodating cavities 522 and the alignment grooves 516 are form in the second substrate 520' simultaneously in the embodiment.

The following is a brief description of how to form the second substrate 520', and the same contents are described with reference to FIG. 17A to FIG. 17I, and will not be described again. In the embodiment, after a protective layer and a pattern defining layer are formed in sequence on the second substrate to be processed (hereinafter, "unpatterned second substrate"), a forth mask is disposed over the unpatterned second substrate. One of the unpatterned second substrate and the forth mask is rotated by an angle relative to the other, so that an angle between the primary flat of the unpatterned second substrate and an arrangement direction having a maximum number of the forth pattern units of the forth mask is (θ+90°*n), wherein θ is between 22° to 39°, and n is an integer. Then, a developing process is performed to remove portions of the pattern defining layer which were not exposed, so that the forth patterns are formed on the unpatterned second substrate. Afterwards, the unpatterned second substrate is subjected to a forth patterning process using the forth patterns as a mask to form the accommodating cavities 522 and the alignment grooves 516. Specifically, the forth patterns are used as a mask to pattern the protective layer, so that a patterned protective layer is formed. The patterned protective layer is then used as a mask to pattern the unpatterned second substrate, so that the accommodating cavities 522 and the alignment grooves 516 are formed simultaneously in a patterned second substrate. Then, the patterned second substrate may be sliced to form a plurality of second substrate 520' as shown in FIG. 19B at the same time.

With respect to the first substrate 510', the method for forming the accommodating grooves 512 and the reflective groove 514 may refer to steps shown in FIG. 14A to FIG. 14F, which is not repeated therein. In the embodiment, the alignment bumps 524 may be formed before the accommodating grooves 512 and the reflective groove 514 are formed. And the method for forming the alignment bumps 524 is similar to steps shown in FIG. 17A to FIG. 17E, except that the unpatterned second substrate is replaced by the first substrate.

In summary, in the manufacturing process of the substrate (the first substrate or the second substrate) of the optical electrical module of the invention, by rotating one of the substrate and the mask at an angle relative to the other, it is possible to form grooves that are sufficiently deep and inclination angles of side walls of the grooves fall within a predetermined angle range. Since the inclination angle of the side wall of the reflective groove falls within the predetermined angle range, the optical power loss due to incorrect tilt angle of the reflective surface in the conventional technique can be improved. In addition, since the accommodating grooves and the reflective groove are formed simultaneously, the angle between the accommodating grooves and the reflective groove can be controlled within 90°±2°, and the light guide elements can be positioned by the accommodating grooves without requiring a complicated alignment process to align the optical fiber, the reflective surface and the light-emitting/receiving element in the conventional technique. Moreover, since a surface contact area between the optical electrical element and the second substrate is large, the optical electrical element can be stably fixed on the second substrate, which improves reliability of the optical electrical module. In an embodiment of the invention, the first substrate can be accurately and stably combined with the second substrate by using the alignment bumps and alignment grooves, so as to improve the process efficiency of the optical electrical module and decrease the fabrication cost thereof.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for manufacturing an optical electrical module, comprising:
    forming a plurality of first patterns on a first substrate by a first mask, wherein an angle between a primary flat of the first substrate and an arrangement direction having a maximum number of first pattern units of the first mask is (θ+90° *n), wherein θ is between 22° to 39°, and n is an integer;
    subjecting the first substrate to a first patterning process using the first patterns as a mask to form a plurality of accommodating grooves and a reflective groove connected with the accommodating grooves in the first substrate, wherein an extension direction of each of the accommodating grooves is perpendicular to an extension direction of the reflective groove.

2. The method for manufacturing the optical electrical module as claimed in claim 1, wherein a depth of each of the accommodating grooves and a depth of the reflective groove are larger than 120 μm, respectively.

3. The method for manufacturing the optical electrical module as claimed in claim 1, wherein side walls of the accommodating grooves and side walls of the reflective groove are respectively inclined surfaces of 42° to 49°.

4. The method for manufacturing the optical electrical module as claimed in claim 1, further comprising:
    patterning a second substrate to form a plurality of accommodating cavities in the second substrate;
    disposing a plurality of optical electrical elements in the accommodating cavities;
    disposing a plurality of light guide elements in the accommodating grooves; and
    bonding the first substrate and the second substrate, wherein the optical electrical elements and the light guide elements are disposed there between.

5. The method for manufacturing the optical electrical module as claimed in claim 4, wherein a plurality of alignment grooves are further formed in one of the first substrate and the second substrate, and a plurality of alignment bumps are further formed in the other one of the first substrate and the second substrate, and the alignment bumps are adapted to be engaged with the alignment grooves when the first substrate and the second substrate are bonded with each other.

6. The method for manufacturing the optical electrical module as claimed in claim 5, wherein a depth of each of the accommodating grooves, a depth of the reflective groove, a depth of each of the alignment grooves, a depth of each of the accommodating cavities and a height of each of the alignment bumps are larger than 120 μm, respectively.

7. The method for manufacturing the optical electrical module as claimed in claim 5, wherein side walls of the accommodating grooves, side walls of the reflective groove, side walls of the alignment grooves, side walls of the accommodating cavities and side walls of the alignment bumps are respectively inclined surfaces of 42° to 49°.

8. The method for manufacturing the optical electrical module as claimed in claim 5, wherein the alignment grooves are formed in the first substrate, and the alignment bumps are formed in the second substrate, the alignment grooves, the accommodating grooves and the reflective groove are formed simultaneously during the first patterning process, a method for forming the alignment bumps comprising:
forming a plurality of second patterns on the second substrate by a second mask, wherein a primary flat of the second substrate and an angle between an arrangement direction having a maximum number of second pattern units of the second mask is (θ+90° *n); and
subjecting the second substrate to a second patterning process using the second patterns as a mask to form the alignment bumps in the second substrate.

9. The method for manufacturing the optical electrical module as claimed in claim 8, wherein the accommodating cavities are formed after the alignment bumps are formed, and a method for forming the accommodating cavities comprising:
forming a plurality of third patterns on the second substrate by a third mask, wherein an angle between a primary flat of the second substrate and an arrangement direction having a maximum number of third pattern units of the third mask is (θ+90° *n); and
subjecting the second substrate to a third patterning process using the third patterns as a mask to form the accommodating cavities.

10. The method for manufacturing the optical electrical module as claimed in claim 5, wherein the alignment grooves are formed in the second substrate, and the alignment bumps are formed in the first substrate, a method for forming the accommodating cavities and the alignment grooves comprising:
forming a plurality of fourth patterns on the second substrate by a fourth mask, wherein an angle between a primary flat of the second substrate and an arrangement direction having a maximum number of fourth pattern units of the fourth mask is (θ+90° *n); and
subjecting the second substrate to a fourth patterning process using the fourth patterns as a mask to form the accommodating cavities and the alignment grooves simultaneously;
a method for forming the alignment bumps comprising:
forming a plurality of second patterns on the first substrate by a second mask, wherein an angle between a primary flat of the first substrate and an arrangement direction having a maximum number of second pattern units of the second mask is (θ+90° *n); and
subjecting the first substrate to a second patterning process using the second patterns as a mask to form the alignment bumps in the first substrate.

11. The method for manufacturing the optical electrical module as claimed in claim 1, wherein an etching rate between a side etching and an under etching is between 1:2 and 1:20 when patterning the first substrate.

12. The method for manufacturing the optical electrical module as claimed in claim 1, wherein an etching solution for patterning the first substrate comprises potassium hydroxide, isopropyl alcohol, $H_2O$, inhibitors, tetramethylammonium hydroxide and methyl alcohol.

* * * * *